United States Patent
Ying et al.

(10) Patent No.: US 8,114,955 B2
(45) Date of Patent: Feb. 14, 2012

(54) ELECTRICALLY CONDUCTING POLYMERS

(75) Inventors: Jackie Y. Ying, Singapore (SG);
Hsiao-Hua Yu, Singapore (SG); Emril Mohamed Ali, Singapore (SG); Eric Assen B Kantchev, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 113 days.

(21) Appl. No.: 12/440,484

(22) PCT Filed: Sep. 26, 2006

(86) PCT No.: PCT/SG2006/000282
§ 371 (c)(1),
(2), (4) Date: May 27, 2009

(87) PCT Pub. No.: WO2008/039151
PCT Pub. Date: Apr. 3, 2008

(65) Prior Publication Data
US 2010/0048815 A1    Feb. 25, 2010

(51) Int. Cl.
*C08G 75/00*    (2006.01)
(52) U.S. Cl. .......... 528/377; 528/380; 528/373
(58) Field of Classification Search .......... 528/377, 528/380, 373
See application file for complete search history.

(56) References Cited

U.S. PATENT DOCUMENTS
6,096,825 A    8/2000 Garnier
2005/0126909 A1    6/2005 Weiller et al.

FOREIGN PATENT DOCUMENTS
EP    0311768 A2    4/1989
WO    99/31494    6/1999
WO    WO 2006018643 A2 *   2/2006

OTHER PUBLICATIONS

McQuade DT et al, Conjugated Polymer-Based Chemical Sensors, Chem. Rev. 2000, 100, 2537-2574.
Bartlett PN et al, The Application of Conducting Polymers in Biosensors, Synthetic Metals 1993, 61, 15-21.
Swager TM, The Molecular Wire Approach to Sensory Signal Amplification, Acc. Chem. Res. 1998, 31, 201-207.
Marsella MJ et al, Designing Conducting Polymer-Based Sensors: Selective Ionochromic Response in Crown Ether Containing Polythiophenes, J. Am. Chem. Soc. 1993, 115, 12214-12215.
Marsella MJ et al, Conducting Pseudopolytaxanes: A Chemoresistive Response via Moleular Recognition, J. Am. Chem. Soc. 1994, 116, 9347-9348.
Marsella MJ et al, Ionoresistivity as a Highly Sensitive Sensory Probe: Investigations of Polythiophenes Functionalized with Calix[4]arene-Based Ion Receptors, J. Am. Chem. Soc. 1995, 117, 9842-9848.

(Continued)

*Primary Examiner* — Randy Gulakowski
*Assistant Examiner* — Shane Fang
(74) *Attorney, Agent, or Firm* — Wood, Herron & Evans, LLP

(57) ABSTRACT

The present invention provides a polymer for use in detecting or quantifying an analyte Exposure of the polymer to the analyte is capable of causing a shift in the onset potential for conductivity or semiconductivity of the polymer. A sensor for an analyte comprising the polymer is also described.

9 Claims, 7 Drawing Sheets poly($C_4$-EDOT-COOH)

poly($C_2$-EDOT-COOH)

poly(EDOT-OH)

OTHER PUBLICATIONS

Holliday BJ et al, Conducting Metallopolymers: The Roles of Molecular Architecture and Redox Matching, Chem. Commun. 2005, 23-36.

Shirakawa H, The Discovery of Polyacetylene Film: The Dawning of an Era of Conducting Polymers (Nobel Lecture), Angew. Chem. Int. Ed. 2001, 40, 2574-2580.

MacDiarmid AG, "Synthetic Metals": A Novel Role for Organic Polymers (Nobel Lecture), Angew. Chem. Int. Ed. 2001, 40, 2581-2590.

Heeger AJ, Semiconducting and Metallic Polymers: The Fourth Generation of Polymeric Materials (Nobel Lecture), Angew. Chem. Int. Ed. 2001, 40, 2591-2611.

Groenendaal, L. "Bert" et al, Poly(3,4-Ethylenedioxythiophene) and Its Derivatives: Past, Present, and Future, Adv. Mater. 2000, 12, No. 7, 481-494.

Groenendaal, L. "Bert" et al, Electrochemistry of Poly(3,4-Alkylenedioxythiophene) Derivatives, Adv. Mater. 2003, 15, No. 11, 855-879.

Roncali J et al, 3,4-Ethylenedioxythiophene (EDOT) as a Versatile Building Block for Advanced Functional π-Conjugated Systems, J. Mater. Chem., 2005, 15, 1589-1610.

Kirchmeyer S et al, Scientific Importance, Properties and Growing Applications of Poly(3,4-Ethylenedioxythiophene), J. Mater. Chem, 2005, 15, 2077-2088.

Kros A et al, Poly(pyrrole) Versus Poly(3,4-Ethylenedioxythiophene): Implications for Biosensor Applications, Sensors and Actuators B 2005, 106, 289-295.

Lima A, et al, Electropolymerization of 3,4-Ethylenedioxythiophene and 3,4-Ethylenedioxythiophene Methanol in the Presence of Dodecylbenzenesulfonate, Synthetic Materials 1998, 93, 33-41.

Akoudad S et al, Modification of the Electrochemical and Electronic Properties of Electrogenerated Poly(3,4-Ethylenedioxythiophene) by Hydroxymethyl and Oligo(oxyethylene) Substituents, Electrochemistry Communications 2000, 2, 72-76.

Mouffouk F, et al, Oligonucleotide-functionalised Poly(3,4-Ethylenedioxythiophene)-coated Microelectrodes Which Show Selective Electrochemcial Response to Hybridisation, Electrochemistry Communications 2006, 8, 317-322.

Navarro A-E et al, Characterization of PEDOT Film Functionalized With a Series of Automated Synthesis Ferrocenyl-Containing Oligonucleotides, Tetrahedron 2005, 61, 3947-3952.

Kittlesen GP et al, Chemical Derivatization of Microelectrode Arrays by Oxidation of Pyrrole and N-Methylpyrrole: Fabrication of Molecule-Based Electronic Devices, J. Am. Chem. Soc. 1984, 106, 7389-7396.

Guiseppe-Elie A et al, Specific Immobilization of Electropolymerized Polypyrrole Thin Films onto Interdigitated Microsensor Electrode Arrays, Langmuir 1995, 11, 1768-1776.

Chiang J-C et al, 'Polyaniline': Protonic Acid Doping of the Emeraldine Form to the Metallic Regime, Synthetic Metals 1986, 13, 193-205.

MacDiarmid AG et al, Polyaniline: A New Concept in Conducting Polymers, Synthetic Metals 1987, 18, 285-290.

Inganas O et al, Proton Modification of Conducting Polypyrrole, J. Phys. Chem. Solids 1984, vol. 45, No. 4, 427-432.

Nishizawa M et al, Penicillin Sensor Based on a Microarray Electrode Coated with pH-Responsive Polypyrrole, Anal. Chem. 1992, 64, 2642-2644.

Talaie A, Conducting Polymer Based pH Detector: A New Outlook to pH Sensing Technology, Polymer 1997, vol. 38 No. 5, 1145-1150.

Lee D et al, Defining Space Around Conducting Polymers: Reversible Protonic Doping of a Canopied Polypyrrole, J. Am. Chem. Soc. 2003, 125, 6870-6871.

Lee D et al, Toward Isolated Molecular Wires: A pH-Responsive Canopied Polypyrrole, Chem. Mater. 2005, 17, 4622-4629.

Yu H-h et al, A Proton-Doped Calix[4]arene-Based Conducting Polymer, J. Am. Chem. Soc. 2003, 125, 1142-1143.

Yu H-h et al, Charge-Specific Interactions in Segmented Conducting Polymers: An Approach to Selective Ionoresistive Responses, Angew. Chem. Int. Ed 2004, 43, 3700-3709.

Bredas JL et al, Polarons, Bipolarons, and Solitons in Conducting Polymers, Acc. Chem. Res. 1985, 18, 309-315.

Schiavon G et al, A Simple Two-Band Electrode for In Situ Conductivity Measurements of Polyconjugated Conducting Polymers, Synthetic Metals 1989, 32, 209-217.

Zotti G et al, Evolution of in situ Conductivity of Polythiophene Deposits by Potential Cycling, Synthetic Metals 1990, 39, 183-190.

Kingsborough RP et al, Polythiophene Hybrids of Transition-Metal Bis(salicylidenimine)s: Correlation Between Structure and Electronic Properties, J. Am. Chem. Soc. 1999, 121, 8825-8834.

Ali et al, Conductivity Shift of Polyethylenedioxythiophenes in Aqueous Solutions from Side-Chain Charge Perturbation, 2007, Macromolecules, 40, 6025-6027.

Carter et al, Voltammetric Studies of Interaction of Tris(1,10-phenanthroline)cobalt(III) with DNA, 1987, J. Am. Chem. Soc. 109, 7528-7530.

Christopoulos, Nucleic Acid Analysis, 1999, Anal. Chem. 71, 425R-438R.

Drummond et al, Electrochemical DNA Sensors, 2003, Nature Biotechnology, vol. 21, No. 10, 1192-1199.

Fan et al, Detection of MicroRNAs Using Target-Guided Formation of Conducting Polymer Nanowires in Nanogaps, 2007, J. Am. Chem. Soc. 129,5437-5443.

Gao et al, Detection of Nucleic Acids Using Enzyme-Catalyzed Template-Guided Deposition of Polyaniline, 2007, Adv. Mater., 19, 602-606.

Palecek et al, Electrochemistry of Nucleic Acids and Development of DNA Sensors, 2002, Critical Reviews in Analytical Chemistry, 32(3); 261-270.

Roncali, Conjugated Poly(thiophenes): Synthesis, Functionalization, and Application, 1992, Chem. Rev., 92, 711-738.

Segura et al, Synthesis and Electropolymerization of a Perylenebisimide-Functionalized 3,4-Ethylenedioxythiophene (EDOT) Derivative, 2005, vol. 7, No. 12, 2345-2348.

Wang et al, Survey and Summary from DNA biosensors to gene chips, 2000, Nucleic Acids Research, vol. 28, No. 16, 3011-3016.

Xie et al, A Nucleic Acid Biosensor for Gene Expression Analysis in Nanograms of mRNA, 2004, Anal. Chem. 76, 4023-4029.

Katz et al, Naphthalenetetracarboxylic Diimide-Based n-Channel Transistor Semiconductors: Structural Variation and Thiol-Enhanced Gold Contacts, 2000, J. Am. Chem. Soc., 122, 7787-7792.

Kelley et al, Electrochemistry of Methylene Blue Bound to a DNA-Modified Electrode, 1997, Bioconjugate Chem., 8, 31-37.

Murahashi et al, Palladium(0)-catalyzed azidation of allyl esters. Selective synthesis of allyl azides, primary allylamines, and related compounds, 1989, J. Org. Chem., 54, 3292-3303.

Park et al, Array-Based Electrical Detection of DNA with Nanoparticle Probes, 2002, Science, vol. 295, 1503-1506.

Sapp et al, High Contrast Ratio and Fast-Switching Dual Polymer Electrochromic Devices, 1998, Chem, Mater., 10, 2101-2108.

Tabakovic et al, Dendrimers Peripherally Modified with Anion Radicals That Form π-Dimers and π-Stacks, 1994, Chem. Mater., 9. 736-745.

Trippe et al, Crown-Tetrathiafulvalenes Attached to a Pyrrole or an EDOT Unit: Synthesis, Electropolymerization and Recognition Properties, 2004, Chem. Eur. J., 10, 6497-6509.

* cited by examiner i. succinic anhydride, Et₃N, DMAP, CH₂Cl₂.
ii. NaH, methyl 2-bromoacetate, NaI, THF. iii. NaOH, THF/H₂O.

EDOT-COOH  →  EDOT-NHS

Capture Probe for immobilization
5'-TTTGAGTCTGTTGCTTGGTCAGC-(A)$_6$-(CH$_2$)$_6$-NH$_2$ Complementary target for hybridization
5'-GCTGACCAAGCAACAGACTCAAA-3'

ELECTRICALLY CONDUCTING POLYMERS

TECHNICAL FIELD

The present invention relates to electrically conducting polymers and to their use in sensors.

BACKGROUND OF THE INVENTION

Conductivity-based sensory devices built on electrically conducting polymers (ECPs) offer great promise for the detection of a wide variety of analytes. They provide a greater current output compared to the traditional amperometry-based devices. Traditionally, intrinsic conductivity of polymers can be increased or reduced by a variety of molecular mechanisms upon analyte binding, including analyte-induced reductions in conjugation length and segmental energy matching/mismatching from adjacent redox-active sites. The difference in conductivity of a typical ECP between its non-conductive and conductive states is commonly 4-5 orders of magnitude. Therefore, the conductimetric response is very attractive for sensor applications.

A disadvantage of many conventional ECPs is that they are somewhat unstable in water, and generally have limited resistance to environmental conditions. Also, they possess relatively high onset potential and narrow conductive window. Further, these ECPs rely on conductivity difference for detections and sensor applications. However, these differences are not always sufficiently large to allow for ultrasensitive detection.

OBJECT OF THE INVENTION

It is the object of the present invention to substantially overcome or at least ameliorate one or more of the above disadvantages.

SUMMARY OF THE INVENTION

In a first aspect of the invention there is provided a polymer for use in detecting or quantifying an analyte, whereby exposure of the polymer to the analyte is capable of causing a shift in the onset potential for conductivity or semiconductivity of said polymer. The onset potential is defined as the potential at which the polymer becomes semiconducting or conducting.

The polymer may be capable of existing in a first form and a second form, whereby exposure of the first form of the polymer to the analyte is capable of generating the second form of the polymer, wherein the onset potential for conductivity or semiconductivity of the first form of the polymer is different to the onset potential for conductivity or semiconductivity of the second form of the polymer. It will be understood that in this case the present invention encompasses both the first and the second form of the polymer. In some embodiments, either the first or the second form of the polymer is a form in which the polymer is coupled to the analyte and the other of the first and the second form of the polymer is a form in which the polymer is not coupled to the analyte, whereby exposure to the analyte of the form of the polymer in which it is not coupled to the analyte results in coupling of the analyte to the polymer to generate the form of the polymer in which the polymer is coupled to the analyte, thereby changing the onset potential for conductivity or semiconductivity of the polymer.

In some embodiments the polymer exhibits two different onset potentials, corresponding to two different concentration ranges of the analyte. The analyte may be for example $H^+$ (or $H_3O^+$), whereby in a first pH range the polymer exists in a first form, having a first onset potential, and in a second pH range the polymer exists in a second form, having a second onset potential. For example, if the first pH range is more basic than the second pH range, the first form may be a deprotonated form, and the second form may be a protonated form. This may be the case if the polymer comprises acidic or basic groups, e.g. $CO_2H$, $SO_3H$, $NH_2$, $NHR$, $NR_2$ etc. The transition pH (i.e. that pH above which the pH is in the first range and below which it is in the second pH) will depend on the nature of the polymer, optionally on the nature of the functional groups on the polymer. The transition pH may be between about 1 and about 12, or between about 1 and 10, 1 and 8, 1 and 7, 1 and 6, 1 and 4, 2 and 12, 4 and 12, 6 and 12, 7 and 12, 9 and 12, 2 and 11, 3 and 10, 4 and 9, 5 and 8, 6 and 8, 2 and 7, 4 and 7, 7 and 11 or 7 and 9, e.g. about 1, 1.5, 2, 2.5, 3, 3.5, 4, 4.5, 5, 5.5, 6, 6.5, 7, 7.5, 8, 8.5, 9, 9.5, 10, 10.5, 11, 11.5 or 12, or may be some other suitable pH.

When the polymer is conducting, it may be highly conducting, or may be weakly conducting.

The polymer may be a derivative of N-substituted polypyrrole, polyfuran, polythiophene or poly(ethylenedioxythiophene). It may be a copolymer of any two or more monomers selected from the group consisting of N-substituted pyrrole, furan, thiophene, ethylenedioxythiophene and derivatives of these. The shift in the onset potential may be due to interaction between the polymer and the analyte, optionally coupling of the analyte to the polymer. The coupling may comprise bonding, e.g. covalent or ionic bonding, or electrostatic coupling, complexing, chelating or some other form of coupling. The polymer may comprise groups which are capable of interacting (e.g. coupling, bonding) with the analyte to cause the shift in the onset potential at which said polymer becomes conducting or semiconducting. The groups may be capable of interacting with the analyte in order to alter the charge density surrounding the polymer backbone. The polymer may comprise one or more monomer units that are 2,5-thiophene or N-substituted 2,5-pyrrole units or 2,5-furan units which are unsubstituted, singly substituted or doubly substituted. The substitution may comprise optionally substituted —X—$CH_2CH_2$—Y— groups (optionally having 1 or more than one substitutent), where X and Y are independently O, S, Se, Te or NR, where R is selected from the group consisting of optionally substituted allyl groups and optionally substituted aryl groups. The substitution on either the 2,5-thiophene or 2,5-pyrrole units or 2,5-furan units or on the —X—$CH_2CH_2$—Y— groups may comprise a group which is capable of interacting with the analyte to cause the shift in the onset potential at which said polymer becomes conducting or semiconducting. The group may be capable of interacting with the analyte in order to alter the charge density surrounding the polymer backbone. Additionally, in the case of 2,5-pyrrole units, there should be substitution on the ring nitrogen atom. The substitution on the ring nitrogen atom may be an optionally substituted alkyl group or an optionally substituted aryl group or may be some other group, e.g. an acyl group, an alkoxy group or an aryloxy group. The polymer may be a poly(ethylenedioxythiophene).

In an embodiment there is provided a polymer for use in detecting or quantifying an analyte, whereby exposure of the polymer to the analyte is capable of causing a shift in the onset potential for conductivity or semiconductivity of said polymer, said polymer comprising monomer units of structure I,

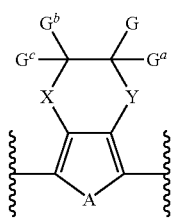

wherein:
A, X and Y are independently selected from the group consisting of O, S, Se, Te and NR, where R is selected from the group consisting of optionally substituted alkyl groups and optionally substituted aryl groups,
G is a group capable of interacting with the analyte, and
$G^a$, $G^b$ and $G^c$ are independently selected from the group consisting of hydrogen, optionally substituted alkyl groups and optionally substituted aryl groups.

The shift in the onset potential for conductivity or semiconductivity may be due to interaction between the polymer and the analyte. The shift in the onset potential for conductivity or semiconductivity of the polymer may be due to the interaction (e.g. bonding or coupling) of group G with the analyte. In some embodiments, both X and Y are both O and A is S. In these and other embodiments, $G^a$, $G^b$ and $G^c$ may be H. G may comprise a group G' wherein G' is capable of interacting with the analyte in order to cause a shift in the onset potential for conductivity or semiconductivity of said polymer. G may have structure L-G', wherein L is a linker group. L may comprise any suitable group capable of linking G' to the ethylenedioxythiophene moiety of the polymer. It may be between 1 and about 20 atoms in length. It may be derived from a hydroxymethyl group. It may comprise a —$CH_2$—O— group. It may comprise $CH_2OCH_2$ or $CH_2OC(=O)CH_2CH_2$.

G may be a group wherein coupling of G with the analyte increases negative charge density surrounding the polymer backbone. Coupling of G with the analyte may alter, e.g. raise or lower, the energy barrier for efficient migration of charge carriers within the polymer backbone. Coupling of G with the analyte may alter the mobility of the charge carriers within the polymer backbone. G may comprise an acidic group. G may be derived from a biomolecule. G may comprise a nucleotide fragment. The nucleotide fragment may be complementary to a nucleic acid sequence in the analyte. The nucleic acid sequence may be a sequence in a DNA, RNA, mRNA, or microRNA. G may comprise a carboxyl (COOH or COO$^-$) group or more than one such group. G may be $CH_2OCH_2CO_2H$ or $CH_2C(=O)CH_2CH_2CO_2H$.

$G^a$, $G^b$ and $G^c$ may each independently be the same as or different to G. Each may independently be the same as or different to each other. Each independently may or may not be a group wherein coupling of said group with the analyte increases negative charge density surrounding the polymer backbone.

The polymer may have a molecular weight (Mn or Mw) between about 2,000 and 2,000,000. It may be a linear polymer, a branched polymer or a crosslinked polymer. It may be a homopolymer (i.e. consist only of the monomer units of structure I together with end groups as appropriate), or it may be a copolymer. Thus in some embodiments the polymer backbone comprises monomer units of structure I together with one or more other monomer units (optionally other ethylenedioxythiophene units or 2,5-thiophene units), provided that exposure of the polymer to the analyte is capable of causing a shift in the onset potential for conductivity or semiconductivity of the polymer. If the polymer is a copolymer, it may be a block copolymer, a random copolymer, an alternating copolymer or some other type of copolymer.

The analyte may be protons (i.e. the onset potential for conductivity or semiconductivity of the polymer may change in response to changing pH), or some other ionic species, or it may comprise a biomolecule, e.g. a protein, a peptide, an enzyme, a DNA strand or fragment, an RNA strand or fragment, a hormone or some other biomolecule.

In another embodiment the polymer is a poly(ethylenedioxythiophene) of structure II,

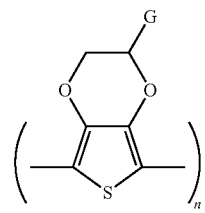

wherein G is a group capable of interacting with an analyte and n is the degree of polymerisation of the poly(ethylenedioxythiophene). Exposure of the poly(ethylenedioxythiophene) to the analyte is capable of causing a shift in the onset potential for conductivity or semiconductivity of said poly(ethylenedioxythiophene).

n may be between about 10 and about 10,000. The shift in the onset potential for conductivity or semiconductivity of the poly(ethylenedioxythiophene) may be due to the interaction of group G with the analyte. G may comprise a carboxyl group, or more than one carboxyl group. G may be derived from a biomolecule, e.g. a nucleotide fragment. G may be for example $CH_2OCH_2CO_2H$ or $CH_2C(=O)CH_2CH_2CO_2H$.

In a second aspect of the invention there is provided a process for making a polymer, said process comprising electropolymerising a monomer of structure III:

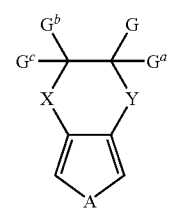

wherein exposure of the polymer to an analyte is capable of causing a shift in the onset potential for conductivity or semiconductivity of said polymer, and wherein:
A, X and Y are independently selected from the group consisting of O, S, Se, Te and NR, where R is selected from the group consisting of optionally substituted alkyl groups and optionally substituted aryl groups,
G is a group capable of interacting with the analyte, and
$G^a$, $G^b$ and $G^c$ are independently selected from the group consisting of hydrogen, optionally substituted alkyl groups and optionally substituted aryl groups.

The polymer may be suitable for use in detecting or quantifying the analyte. The shift in the onset potential for conductivity or semiconductivity of the polymer may be due to the interaction of group G with the analyte. In some embodiments, A is S and both X and Y are both O.

The electropolymerising may comprise homopolymerising or copolymerising. In structure III, G, $G^a$, $G^b$ and $G^c$ may be as described earlier. The electropolymerising may comprise applying an electric current across a monomer solution. It may comprise cycling the voltage between two electrodes, said electrodes being in contact with the monomer solution. The electrodes may act as substrates on which the polymer forms. The upper voltage of the cycling voltage may be between about 0 and about 2 V, or between about 0.5 and about 1.5V. The lower voltage of the cycling voltage may be between about 0 and about −2V, or between about −0.5 and about −1.5V. The voltage difference between the upper and lower cycling voltages may be between about 1 and about 3V, or between about 1 and about 2V. The scan rate of the voltage cycling may be between about 10 and about 200 mV/s. The electropolymerising may be conducted for between about 10 s and about 1 hour. It may comprise between about 1 and about 100 voltage cycles.

The monomer solution comprises a monomer of structure III, and may optionally comprise one or more additional monomers (e.g. other ethylenedioxythiophenes or other thiophenes, furans, N-substituted pyrroles etc.) capable of electrocopolymerising with the monomer of structure III. If additional monomers are present, they should be such that the polymer is capable of interacting with an analyte in order to cause a shift in the onset potential for conductivity or semiconductivity of said polymer. The additional monomer(s) should be such that the polymer is capable of conducting an electric current.

The monomer solution may be between about 1 and 50 mM in monomer or, in the event that more than one monomer is present, in each monomer or in total monomer. The monomer solution may comprise a solvent capable of dissolving the monomer(s). It may comprise an organic solvent. It may comprise a polar solvent. It may comprise one or more separate solvents. The monomer solution should also comprise an electrolyte. The electrolyte should be at least partially soluble in the monomer solution. It may be an ionic electrolyte. It may be at least partially soluble in an organic solvent. The electrolyte may be present in the monomer solution between about 10 and 1000 mM.

In a third aspect of the invention there is provided a process for making a polymer comprising:
    electropolymerising a monomer of structure IV to form a precursor polymer,

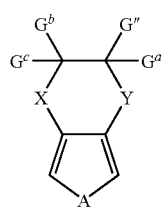

IV wherein G" is capable of coupling with a sensing compound to generate the polymer, whereby exposure of said polymer to an analyte is capable of causing a shift in the onset potential for conductivity or semiconductivity of said polymer, A, X and Y are independently selected from the group consisting of O, S, Se, Te and NR, where R is selected from the group consisting of optionally substituted alkyl groups and optionally substituted aryl groups, and $G^a$, $G^b$ and $G^c$ are independently selected from the group consisting of hydrogen, optionally substituted alkyl groups and optionally substituted aryl groups; and
    coupling the sensing compound to the groups G" of the precursor polymer.

G" may comprise an N-hydroxysuccinimide group. The sensing compound may be capable of coupling with the analyte. The sensing compound may be aminofunctional. It may comprise an $NH_2$ group. The sensing compound may be an amino-functionalized oligodeoxynucleotide, a nucleotide (e.g. a short nucleotide), an antibody, a protein, a peptide or some other biomolecule containing an $NH_2$ group. In some embodiments, A is S and X and Y are both O. G, $G^a$, $G^b$ and $G^c$ may be as described earlier.

The polymer may be suitable for use in detecting or quantifying the analyte. The process for electropolymerising may be as described in the second aspect of the invention, with the exception that group G is replaced by group G". The precursor polymer may have a molecular weight (Mn or Mw) between about 2,000 and 2,000,000. It may be a linear polymer, a branched polymer or a crosslinked polymer. It may be a homopolymer, or it may be a copolymer. Thus in some embodiments the precursor polymer backbone comprises ethylenedioxythiophene monomer units bearing group G" together with one or more other monomer units (optionally other ethylenedioxythiophene monomer units or other thiophene units), provided that exposure of a polymer obtained by coupling the precursor polymer to the sensing compound is capable of causing a shift in the onset potential for conductivity or semiconductivity of the polymer. If the precursor polymer is a copolymer, it may be a block copolymer, a random copolymer, an alternating copolymer or some other type of copolymer.

The invention also provides a polymer when made by the process of the second or third aspect.

In a fourth aspect of the invention there is provided sensor for an analyte comprising a polymer, wherein exposure of the polymer to the analyte is capable of causing a shift in the onset potential for conductivity or semiconductivity of said polymer.

In an embodiment, the polymer comprises monomer units of structure I as defined earlier. In another embodiment the polymer is a poly(ethylenedioxythiophene) of structure II as defined earlier. The polymer may be according to the first aspect of the invention. It may be made according to the second or third aspect of the invention.

In a fifth aspect of the invention there is provide the use of a polymer for the manufacture of a sensor for an analyte, whereby exposure of the polymer to the analyte is capable of causing a shift in the onset potential for conductivity or semiconductivity of said polymer. The polymer may comprise monomer units of structure I as defined earlier. It may comprise a polymer of structure II as defined earlier. It may be a polymer according to the first aspect of the invention, or a polymer made by the second or third aspect of the invention.

In a sixth aspect of the invention there is provided a method of analysing for an analyte in a matrix comprising:
    exposing a sensor to the matrix, said sensor comprising a polymer; and
    determining the onset potential for conductivity or semiconductivity of said polymer;
whereby exposure of the polymer to the analyte is capable of causing a shift in the onset potential for conductivity or semiconductivity of said polymer.

The polymer may be such that exposure of the polymer to the analyte is capable of causing a shift in the onset potential for conductivity or semiconductivity of said polymer. The polymer may comprise monomer units of structure I as defined earlier. It may be a polymer of structure II as defined earlier. It may be a polymer according to the first aspect of the invention, or a polymer made by the second or third aspect of the invention. The matrix may be in the form of a liquid, a gas, a gel, a paste, a slurry, a solid or a combination of any two or more of these. The analysing may be analysing for the presence or absence of the analyte in the matrix, or may be analysing for the concentration of the analyte in the matrix or may be analysing for a particular concentration or minimum concentration of the analyte. The method may also comprise comparing the determined onset potential with a reference value, or with a calibration curve in order to determine the presence or absence of the analyte in the matrix, or the concentration of the analyte in the matrix or whether a minimum concentration (i.e. threshold concentration) of the analyte is present.

DETAILED DESCRIPTION OF THE INVENTION

The present invention relates to a polymer for use in detecting or quantifying an analyte, wherein exposure of the polymer to the analyte is capable of causing a shift in the onset potential at which said polymer becomes conducting or semiconducting. In particular, within a particular range of concentrations of the analyte, exposure of the is polymer to the analyte causes a shift in said onset potential. The shift may be due to an interaction between the polymer and the analyte. Thus by measuring the shift in the onset of the polymer, it may be possible to determine the presence or absence, optionally the concentration, of the analyte or the presence of the analyte over a predetermined concentration. The polymer may comprise chemical groups which are capable of interacting, e.g. coupling, bonding or associating, with the analyte to cause the shift in the onset potential at which said polymer becomes conducting or semiconducting. The groups may be capable of interacting with the analyte in order to alter the charge density surrounding the polymer backbone. The change in the charge density causes a change in the resistance to the flow through the polymer of charge carriers, thereby causing a shift in the onset potential at which the polymer becomes conducting or semiconducting.

When passing through the onset potential from a low conductivity state to a high conductivity state, the conductivity of the polymer may increase by a factor of at least about 100, or at least about 500, 1,000, 5,000, 10,000, 50,000 or 100,000 (or the resistivity may reduce by a factor of at least about 100, or at least about 500, 1000, 5000, 10000, 50000 or 100000). The conductivity may increase (or the resistivity decrease) by between about $10^2$ and $10^6$, or between about $10^3$ and $10^6$, $10^4$ and $10^6$, $10^5$ and $10^6$, $10^2$ and $10^5$, $10^2$ and $10^4$, $10^2$ and $10^3$, $10^3$ and $10^6$ or $10^3$ and $10^5$, e.g. by about 100, 500, 1,000, 5,000, 10,000, 50,000, 100,000, 500,000 or 1,000,000. When passing through the onset potential from the high conductivity state to the low conductivity state, the conductivity may decrease (or the resistivity increase) by a similar factor.

The conductivity of the polymer in its fully conductive state may be substantially independent of the concentration of the analyte. In this context, "substantially independent" may refer to a situation in which a variation in the concentration of the analyte causes a change of less than about 10% in the conductivity of the polymer in its fully conductive state, or less than about 9, 8, 7, 6, 5, 4, 3, 2, 1, 0.5 or 0.1%. Thus, at any particular analyte concentration in the matrix in which the polymer is immersed, sweeping the voltage between an electrode comprising the polymer and a reference electrode will result in a change in the conductivity of the polymer and hence a change in current. At a first voltage, the polymer will have very low conductivity, optionally approximately zero conductivity. At some voltage, which is a function of the concentration of the analyte, the conductivity will start to increase, and will continue to increase as the voltage is swept until the conductivity of the polymer reaches a non-zero plateau value, at which voltage the polymer is considered to be in its fully conductive state. It is this plateau value of conductivity that may be substantially independent of the concentration of the analyte. The polymer may be an undoped polymer. It may comprise no metal ions or atoms for enhancing conductivity.

The backbone of the polymer may comprise a polythiophene or an N-substituted polypyrrole or a polyfuran backbone. The polymer may comprise one or more monomer units that are 2,5-thiophene or N-substituted 2,5-pyrrole or 2,5-furan units which are unsubstituted (except for N-substitution of the pyrrole units), singly substituted, or doubly substituted, or, for 2,5-pyrrole units, triply substituted. The substitution may be in the 3 and/or 4 position of the rings. The substituents may be the same or may be different, or may form a ring fused with the 2,5-thiophene or 2,5-pyrrole or 2,5-furan. The substitution may comprise —X—C(G)($G^a$)C($G^b$)($G^c$)-Y— groups, where X and Y are independently O, S, Se, Te or NR, where R is selected from the group consisting of optionally substituted alkyl groups and optionally substituted aryl groups. G may be a group capable of interacting with an analyte in order to shift the onset potential for conductivity or semiconductivity of the polymer. $G^a$, $G^b$ and $G^c$ may be independently selected from the group consisting of hydrogen and optionally substituted alkyl or aryl groups, which may be the same as or different to R, but selected from the same group. The alkyl group may be a C1 to C6 alkyl group (i.e. having 1, 2, 3, 4, 5 or 6 carbon atoms). It may be straight chain, branched chain (for C3 or greater) or cyclic (for C3 or greater). The aryl group may be heteroaryl or homoaryl (i.e. may or may not have one or more ring heteroatoms), and may optionally be a fused aryl group. The substitution on the alkyl or aryl group may be an alkyl or aryl group or may be a functional group e.g. carbonylalkyl, carbonylaryl, alkoxy, aryloxy, optionally substituted amino, aldehyde etc. The substitution on the ring nitrogen atom may be optionally substituted alkyl (e.g. C1 to C6 alkyl) or aryl group. In some embodiments, $G^a$, $G^b$ and $G^c$ are hydrogen. Suitable groups for $G^a$, $G^b$, $G^c$ and R include for example hydrogen (except for R), methyl, ethyl, propyl, isopropyl, butyl, isobutyl, tert-butyl, higher alkyl, phenyl, naphthyl, phenylmethyl, 2-, 3- or 4-tolyl, chloromethyl, 2-chloroethyl, acetyl, benzyl, benzoyl, carboxyethyl etc.

In some embodiments, the invention relates to a polymer comprising monomer units of structure I. In structure I, G is capable of interacting with an analyte in order to shift the onset potential for conductivity or semiconductivity of the polymer. In some embodiments, G comprises a group G' wherein G' is the active group capable of interacting with the analyte. G' may be linked to the polymer by a linker group L. X and Y of structure I are independently selected from the group consisting of O, S, Se, Te and NR, where R is selected from the group consisting of optionally substituted alkyl groups and optionally substituted aryl groups, and commonly both X and Y are both O, although in some embodiments they may be O and S respectively, S and O respectively, both S, O and Se respectively, Se and O respectively, O and NR respectively, NR and Se respectively, or some other combination of O, S, Se, Te and NR.

G (or G') may be capable of coupling with an analyte to increases the negative charge density surrounding the polymer backbone. The increase in negative charge may alter the mobility of the charge carriers within the polymer backbone, and thereby shift the onset potential for conductivity or semi-conductivity of the polymer. The binding may shift the onset potential by between about 0.1 and about 1V, or between about 0.1 and 0.5, 0.1 and 0.3, 0.1 and 0.2, 0.2 and 1, 0.5 and 1, 0.2 and 0.5 or 0.2 and 0.4V, e.g. about 0.1, 0.15, 0.2, 0.25, 0.3, 0.35, 0.4, 0.45, 0.5, 0.6, 0.7, 0.8, 0.9 or 1V.

L may be any suitable linker group. It may be between 1 and about 20 atoms in length, or between 1 and 10, 1 and 5, 1 and 3, 2 and 20, 5 and 20, 10 and 20, 2 and 10 or 2 and 5 atoms in length, e.g. 1, 2, 3, 4, 5, 6, 7, 8, 9, 10, 11, 12, 13, 14, 15, 16, 17, 18, 19 or 20 atoms in length. It may comprise ether linkages. It may optionally comprise side chains, carbonyl groups or other functional groups. It may be a hydrophilic side chain. It may be derived from a hydroxymethyl group. It may comprise $CH_2OCH_2$. It may comprise $CH_2C(=O)CH_2CH_2$.

G or G' may comprise a group capable of binding selectively with an analyte. G or G' may comprise an acidic group or a basic group. They may comprise for example a carboxylic acid group, a thiocarboxylic acid group, a dithiocarboxylic acid group, a phosphonic acid group, a sulfonic acid group, a sulfinic acid group, a sulfuric acid monoester, an ammonium group (optionally mono- or di-alkyl or -aryl substituted) or some other acidic group, or an amine (optionally mono- or di-alkyl or -aryl substituted) or some other basic group. G or G' may comprise a group capable of binding with an ionic analyte. It may comprise a complexing group, a chelating group (e.g. bi-, tri- or tetradentate) e.g. an EDTA-derived group (EDTA is ethylenediamine tetraacetic acid, and is capable of complexing $Ca^{2+}$ and/or $Pb^{2+}$ ions), or some other complexing group. G or G' may be derived from a biomolecule. G or G' may comprise a nucleotide fragment, an oligodeoxynucleotide (for example an aminofunctional oligodeoxynucleotide), a protein, a protein fragment, a peptide (synthetic or natural), an enzyme, an antibody fragment (e.g. $F_{ab}$, $F_c$), a nucleotide or some other biomolecule. The biomolecule may for example have a molecular weight between about 100 and about 20,000, or between about 100 and 10,000, 100 and 5,000, 100 and 2,000, 100 and 1,000, 100 and 500, 500 and 20,000, 1,000 and 20,000, 5,000 and 20,000, 10,000 and 20,000, 500 and 10,000, 500 and 5,000 or 1,000 and 5,000, e.g. about 100, 200, 300, 400, 500, 600, 700, 800, 900, 1,000, 1,500, 2,000, 2,500, 3,000, 3,500, 4,000, 4,500, 5,000, 6,000, 7,000, 8,000, 9,000, 10,000, 11,000, 12,000, 13,000, 14,000, 15,000, 16,000, 17,000, 18,000, 19,000 or 20,000 or some other suitable value.

The polymer may have a molecular weight (Mn or Mw) between about 2,000 and about 2,000,000, or between about 2000 and 1000000, 2000 and 500000, 2000 and 100000, 2000 and 50000, 2000 and 10000, 2000 and 5000, 10000 and 2000000, 100000 and 2000000, 1000000 and 2000000, 10000 and 1000000, 10000 and 100000 or 100000 and 1000000, for example about 2000, 3000, 4000, 5000, 6000, 7000, 8000, 9000, 10000, 15000, 20000, 25000, 30000, 35000, 40000, 45000, 50000, 60000, 70000, 80000, 90000, 100000, 200000, 300000, 400000, 500000, 600000, 700000, 800000, 900000, 1000000, 1500000 or 2000000, or some other suitable molecular weight. It may have a degree of polymerisation n of between about 10 and about 10000, or between about 10 and 1000, 10 and 500, 10 and 200, 10 and 100, 10 and 50, 10 and 20, 20 and 10000, 50 and 10000, 100 and 10000, 1000 and 10000, 5000 and 10000, 50 and 5000, 50 and 1000, 50 and 500, 50 and 100, 100 and 1000, 100 and 500 or 500 and 1000, e.g. about 10, 15, 20, 25, 30, 35, 40, 45, 50, 60, 70, 80, 90, 100, 150, 200, 250, 300, 350, 400, 450, 500, 600, 700, 800, 900, 1000, 2000, 3000, 4000, 5000, 6000, 7000, 8000, 9000 or 10000. It may have a narrow or broad molecular weight distribution. It may have a polydispersity of between about 1 and about 10, or between about 1 and 5, 1 and 2, 2 and 10, 50 and 10, 1.5 and 5 or 2 and 5, e.g. about 1, 1.1, 1.2, 1.3, 1.4, 1.5, 1.6, 1.7, 1.8, 1.9, 2, 2.5, 3, 3.5, 4, 4.5, 5, 5.5, 6, 6.5, 7, 7.5, 8, 8.5, 9, 9.5 or 10, or may be more than 10.

The polymer may be a homopolymer (e.g. consist only of the groups of structure I together with end groups as appropriate), or it may be a copolymer. In a homopolymer or in a copolymer, each monomer unit may polymerise into the growing polymer in one of two orientations. Thus, for thiophene-based monomer units, the polymer may comprise any one or more of the following diad structures:

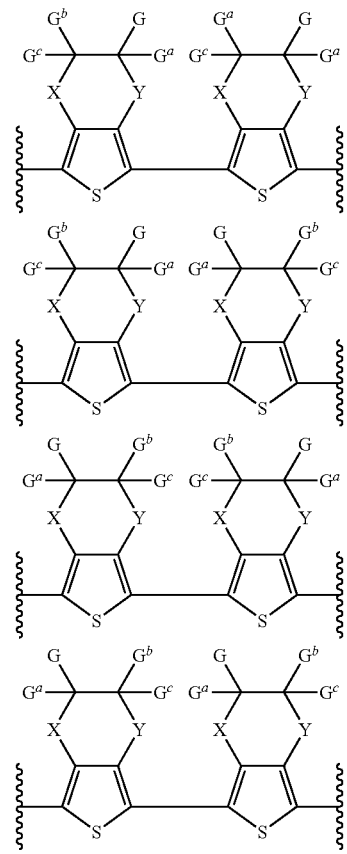

It will be understood that for certain options of G, $G^a$, $G^b$ and $G^c$, asymmetric centres may be present in the polymer, and that the invention envisages all of the possible combinations of configurations for those optical centres.

The polymer backbone may comprise monomer units of structure I together with one or more other monomer units. The other unit(s) if present should be such that exposure of the polymer to the analyte shifts the onset potential for conductivity or semiconductivity of the polymer. Suitable other units include other ethylenedioxythiophene groups, other substituted 2,5-thiophenediyl units, optionally substituted at the 3 and/or 4 positions of the thiophene ring, 2,5-furan units etc. The monomer unit of structure I may represent at least about 5% by weight or mole of the total monomer units of the polymer, or at least about 10, 15, 20, 30, 40, 50, 60, 70, 80, 90 or 95% of the total monomer units of the polymer, and may be about 5, 10, 15, 20, 30, 40, 50, 60, 70, 80, 90, 91, 92, 93, 94, 95, 96, 97, 98, 99, 99.1, 99.2, 99.3, 99.4, 99.5, 99.6, 99.7, 99.8 or 99.9% of the total monomer units of the polymer or may represent 100% thereof.

The analyte may be protons, so that changing pH leads to a change in the onset potential for conductivity or semiconductivity of the polymer may change in response to changing pH, or may be some other ionic species, or it may comprise a biomolecule, e.g. a protein, a peptide, a nucleotide, a nucleotide fragment, an enzyme, a DNA strand or fragment, an RNA strand or fragment, a hormone or some other biomolecule.

The polymer may be a copolymer comprising two or more different sensing monomer units, whereby the different sensing monomer units sense different analytes. Thus for example it may be a copolymer comprising two different monomer units of structure I, where a first monomer unit comprises a carboxylic acid group for sensing pH and a second monomer unit comprises a monomer unit comprising an oligodeoxynucleotide group for sensing a biomolecule analyte. In this example, by monitoring different step changes in conductivity, the presence of absence of more than one analyte may be determined.

The polymer of the present invention may be made by electropolymerising a monomer of structure III as described earlier. In structure III, G is a group capable of interacting with an analyte in order to shift the onset potential for conductivity or semiconductivity of said polymer, and X and Y are, independently, O, S, Se, Te and NR, where R is selected from the group consisting of optionally substituted alkyl groups and optionally substituted aryl groups. $G^a$, $G^b$, $G^c$ and R have been described earlier.

The electropolymerising may comprise applying an electric current across a monomer solution. Thus the voltage between two electrodes at least partially immersed in the monomer solution may be cycled between an upper and a lower voltage. The electrodes may act as substrates on which the polymer forms and may be shaped as required for the desired shape of the polymer. The electrode on which the polymer forms may be for example elongated, cylindrical, ovoid, planar (circular, square, triangular, rectangular or other polyhedral etc.), acicular, or some other required shape. The electrode may be a button electrode or may comprise interdigitated microelectrodes. It may be a suitable shape such that, when the polymer has formed thereon, the electrode is suitable for use as a sensing electrode for the analyte to which the polymer responds.

The upper voltage of the cycling voltage may be between about 0 and about 2 V, or between about 0 and 1.5, 0 and 1, 0 and 0.5, 0.5 and 2, 1 and 2, 1.5 and 2, 0.5 and 1.5, 1 and 1.5, 1 and 1.3 or 1.1 and 1.3V, e.g. about 0, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9 or 2V. The lower voltage of the cycling voltage may be between about 0 and about −2V, or between about 0 and −1.5, 0 and −1, 0 and −0.5, 0.5 and −2, −1 and −2, −1.5 and −2, −0.5 and −1.5, −1 and −1.5, −0.2 and −0.8, −0.3 and −0.7 or −0.4 and −0.6V, e.g. about 0, −0.1, −0.2, −0.3, −0.4, −0.5, −0.6, −0.7, −0.8, −0.9, −1, −1.1, −1.2, −1.3, −1.4, −1.5, −1.6, −1.7, −1.8, −1.9 or −2V. The voltage difference between the upper and lower cycling voltages may be between about 1 and about 3V, or between about 1 and 2, 2 and 3, 1.5 and 2.5, 1.5 and 2, 1.6 and 1.9 or 1.6 and 1.8V, e.g. about 1, 1.1, 1.2, 1.3, 1.4, 1.5, 1.6, 1.7, 1.8, 1.9, 2, 2.1, 2.2, 2.3, 2.4, 2.5, 2.6, 2.7, 2.8, 2.9 or 3V. The scan rate of the voltage cycling may be between about 10 and about 200 mV/s, or between about 10 and 150, 10 and 100, 10 and 50, 50 and 200, 100 and 200, 150 and 200, 100 and 150, 50 and 150, 80 and 120 or 90 and 110 mV/s, e.g. about 10, 20, 30, 40, 50, 60, 70, 80, 90, 100, 110, 120, 130, 140, 150, 160, 170, 180, 190 or 200 mV/s. The electropolymerising may be conducted for between about 1 s and about 1 hour, or between about 1 s and 30 minutes, 1 s and 1 minute, 1 and 30 s, 1 and 10 s, 10 s and 30 minutes, 10 s and 1 minute, 10 and 30 s, 30 s and 1 hour 1 minute and 1 hour 10 minutes and 1 hour, 30 minutes and 1 hour, 30 s and 30 minutes, 1 and 30 minutes, 1 and 10 minutes, 30 seconds and 10 minutes, 30 seconds and 2 minutes or 2 minutes and 8 minutes, e.g. about 1, 2, 3, 4, 5, 6, 7, 8, 9, 10, 20, 30, 40 or 50 seconds, or about 1, 1.5, 2, 2.5, 3, 3.5, 4, 4.5, 5, 6, 7, 8, 9, 100, 15, 20, 25, 30, 35, 40, 45, 50, 55 or 60 minutes. It may comprise between about 1 and about 100 voltage cycles, or between about 1 and 50, 1 and 20, 1 and 10, 1 and 5, 5 and 100, 10 and 100, 50 and 100, 5 and 50, 5 and 20 or 2 and 10 cycles, e.g. about 1, 2, 3, 4, 5, 6, 7, 8, 9, 10, 15, 20, 25, 30, 35, 40, 45, 50, 60, 70, 80, 90 or 100 cycles.

The monomer solution used for making the polymer may comprise a monomer of structure III, as described earlier, and may optionally comprise one or more additional monomers capable of copolymerising with the monomer of structure III. These additional monomers may be for example optionally substituted thiophenes, e.g. optionally substituted ethylenedioxythiophenes, or N-substituted pyrroles (optionally also C-substituted) or furans. They may be substituted with one or more carboxylic acid groups, a thiocarboxylic acid groups, a dithiocarboxylic acid groups, phosphonic acid groups, sulfonic acid groups, sulfinic acid groups, sulfuric acid monoesters, ammonium groups (optionally mono-, di- or tri-alkyl or aryl substituted) or other acidic groups, or amines (optionally mono-, di- or tri-alkyl or aryl substituted) or other basic groups. They may comprise groups capable of binding with an ionic analyte. They may comprise complexing groups, chelating groups (e.g. bi-, tri- or tetradentate) e.g. EDTA-derived groups, or other complexing groups. They may be derived from a biomolecule. If one or more additional monomers are present, they should be such that exposure of the polymer to an analyte is capable of causing a shift in the onset potential for conductivity or semiconductivity of said polymer. The additional monomer(s) should be such that the polymer is capable of conducting an electric current. The monomer of structure III should be at least about 5% by weight or mole of the total monomer content of the monomer solution, or at least about 10, 15, 20, 30, 40, 50, 60, 70, 80, 90 or 95% of the total monomer content of the monomer solution, and may be about 5, 10, 15, 20, 30, 40, 50, 60, 70, 80, 90, 91, 92, 93, 94, 95, 96, 97, 98, 99, 99.1, 99.2, 99.3, 99.4, 99.5, 99.6, 99.7, 99.8 or 99.9% of the total monomer content of the monomer solution.

The monomer solution may be between about 1 and about 50 mM in monomer, or between about 1 and 20, 1 and 10, 1 and 5, 5 and 50, 10 and 50, 20 and 50, 5 and 20 or 5 and 15 mM, e.g. about 1, 2, 3, 4, 5, 6, 7, 8, 9, 10, 11, 12, 13, 14, 15, 16, 17, 18, 19, 20, 25, 30, 35, 40, 45 or 50 mM or some other concentration. In the event that more than one monomer is present, this concentration may be the concentration of each monomer in the monomer solution or may be the total concentration of monomer in the monomer solution. The monomer solution may comprise a solvent capable of dissolving the monomer(s). It may comprise an organic solvent. It may comprise a polar solvent. It may comprise one or more separate solvents. Suitable solvents include acetonitrile, acetone, N-methylpyrrolidone, dimethyl sulfoxide, dichloromethane, propylene carbonate, N,N-dimethylformamide and water, as well as mixtures of any two or more of these (provided those mixtures provided a single phase solvent mixture) depending on the nature of the monomer(s) etc. The monomer solution should also comprise an electrolyte. The electrolyte should be at least partially soluble in the monomer solution. It may be an ionic electrolyte. It may be at least partially soluble in an organic solvent. Suitable electrolytes include alkylammonium salts, hexafluorophosphate salts, alkaline metal ion salts, perchlorate salts, tetrafluoroborate salts etc. The electrolyte may be present in the monomer solution between about 10 and about 1000 mM, or between about 10 and 500, and 100, 10 and 50, 50 and 1000, 100 and 1000, 500 and 1000, 50 and 500 or 50 and 200 mM, e.g. about 10, 20, 30, 40, 50, 60, 70, 80, 90, 100, 110, 120, 130, 140, 150, 200, 250, 300, 350, 400, 450, 500, 600, 700, 800, 900 or 1000 mM.

Another process for making a polymer according to the present invention comprises electropolymerising a monomer of structure IV to form a precursor polymer, and then coupling a sensing compound to the groups G" of the precursor polymer. G" is capable of coupling with the sensing compound to generate the polymer. G" may comprise an N-hydroxysuccinimide group, or some other group capable of coupling to an amine. The sensing compound may be amino-functionalized, for example an amino-functionalized oligodeoxynucleotide.

The process for electropolymerising may be as described above, with the exception that group G is replaced by group G". The precursor polymer (Mn or Mw) between about 2,000 and 2,000,000, or between about 2000 and 1000000, 2000 and 500000, 2000 and 100000, 2000 and 50000, 2000 and 10000, 2000 and 5000, 10000 and 2000000, 100000 and 2000000, 1000000 and 2000000, 10000 and 1000000, 10000 and 100000 or 100000 and 1000000, for example about 2000, 3000, 4000, 5000, 6000, 7000, 8000, 9000, 10000, 15000, 20000, 25000, 30000, 35000, 40000, 45000, 50000, 60000, 70000, 80000, 90000, 100000, 200000, 300000, 400000, 500000, 600000, 700000, 800000, 900000, 1000000, 1500000 or 2000000, or some other suitable molecular weight. It may have a degree of polymerisation n of between about 10 and about 10000, or between about 10 and 1000, 10 and 500, 10 and 200, 10 and 100, 10 and 50, 10 and 20, 20 and 10000, 50 and 10000, 100 and 10000, 1000 and 10000, 5000 and 10000, 50 and 5000, 50 and 1000, 50 and 500, 50 and 100, 100 and 1000, 100 and 500 or 500 and 1000, e.g. about 10, 15, 20, 25, 30, 35, 40, 45, 50, 60, 70, 80, 90, 100, 150, 200, 250, 300, 350, 400, 450, 500, 600, 700, 800, 900, 1000, 2000, 3000, 4000, 5000, 6000, 7000, 8000, 9000 or 10000. It may have a narrow or broad molecular weight distribution. It may have a polydispersity of between about 1 and about 10, or between about 1 and 5, 1 and 2, 2 and 10, 50 and 10, 1.5 and 5 or 2 and 5, e.g. about 1, 1.1, 1.2, 1.3, 1.4, 1.5, 1.6, 1.7, 1.8, 1.9, 2, 2.5, 3, 3.5, 4, 4.5, 5, 5.5, 6, 6.5, 7, 7.5, 8, 8.5, 9, 9.5 or 10, or may be more than 10.

It may be a linear polymer, a branched polymer or a crosslinked polymer. It may be a homopolymer or it may be a copolymer. Thus in some embodiments the precursor polymer backbone comprises ethylenedioxythiophene monomer units bearing group G" together with one or more other monomer units (optionally other ethylenedioxythiophene monomer units), provided that exposure of a polymer obtained by coupling groups G" with the sensing compound to the analyte shifts the onset potential for conductivity or semiconductivity of the polymer. If the precursor polymer is a copolymer, it may be a block copolymer, a random copolymer, an alternating copolymer or some other type of copolymer.

Coupling of the sensing compound to the precursor polymer may comprise exposing the polymer to the sensing compound, optionally to a solution of the sensing compound. The coupling may be conducted at room temperature or at some other temperature which does not degrade the sensing compound or the precursor polymer. Suitable temperatures are commonly between about 10 and about 40° C., or between about 10 and 30, 10 and 20, 20 and 40, 30 and 40 or 20 and 30° C., e.g. about 10, 15, 20, 25, 30, 35 or 40° C., however may depend on the nature of the sensing compound and the precursor polymer, and on the reactivity of the sensing compound to the precursor polymer. The time for the coupling will depend on the reactivity of the sensing compound to the precursor polymer, on the temperature and on the concentration of the sensing compound in the solution thereof. The time may be between about 1 and 24 hours, or between about 1 and 18, 1 and 12, 1 and 10, 5 and 24, 10 and 24, 12 and 24, 18 and 24, 1 and 5, 1 and 2, 2 and 10, 5 and 10, 2 and 5 or 3 and 5 hours, and may be about 1, 1.5, 2, 2.5, 3, 3.5, 4, 4.5, 5, 6, 7, 8, 9, 10, 11, 12, 13, 1, 4 15, 16, 17, 18, 19, 20, 21, 22, 23 or 24 hours, or may be some other suitable time. In a representative process, a solution (optionally an aqueous solution) of the sensing compound is applied to the polymer in an environment that discourages evaporation of the solvent of the solution. For example, if the solvent is water, the environment may have high, optionally 90-100%, humidity. The solution may then be left is in contact with the polymer for a suitable time, and may then be washed to remove unreacted sensing compound.

The invention also provides a sensor for an analyte comprising a polymer comprising monomer units of structure I as defined earlier. The sensor may be an ion sensor, a pH sensor, a biomolecule sensor or some other type of sensor. The sensor may comprise an electrode having the polymer coated on at least a portion thereof. The sensor may be made by polymerising a monomer on the electrode, and if necessary modifying the resulting polymer as necessary, or it may comprise at least partially coating the electrode with the polymer. The at least partially coating may comprise immersing the electrode in a solution of the polymer, and then allowing the solvent to evaporate, or it may comprise immersing the electrode in the molten polymer and then allowing the polymer to solidify.

The sensor may be used for analysing for an analyte in a matrix. A suitable method for said analysing comprises exposing the sensor to the matrix, and determining the onset potential for conductivity or semiconductivity of the polymer. The step of determining the onset potential may comprise changing (optionally sweeping) the potential applied to the sensor through a voltage range. The method may include determining whether the onset potential of the polymer occurs within the voltage range, and thereby determining the concentration of the analyte, or determining if the analyte is present at or above a threshold concentration. The voltage range should include the onset potential of at least one of the forms of the polymer, as defined earlier. The sweep may be conducted at a rate of between about 1 and about 100 mV/s, or between about 1 and 50, 1 and 20, 1 and 10, 1 and 5, 5 and 100, 10 and 100, 20 and 100, 50 and 100, 5 and 50, 5 and 20, 7 and 12 or 9 and 11 mV/s, e.g. about 1, 2, 3, 4, 5, 6, 7, 8, 9, 10, 11, 12, 13, 14, 15, 16, 17, 18, 19, 20, 25, 30, 35, 40, 45, 50, 60, 70, 80, 90 or 100 mV/s. The analyte may be in solution, or, in some embodiments, it may be neat. The matrix may be in the form of a liquid, a gel, a paste, a slurry, a solid or a combination of any two or more of these. The analysing may be analysing for the presence or absence of the analyte in the matrix, or may be analysing for the concentration of the analyte in the matrix or may be analysing to determine if the concentration of the analyte is above or below a threshold value. It may be for analysing for the concentration of the analyte in the matrix between two predetermined limits, e.g. it may analyse for pH (i.e. hydrogen ion concentration) between about 4 and about 7, or between about 4 and about 5, about 5 and about 6 or about 6 and about 7. The matrix should be an electrically conducting matrix, and it may be necessary to add an electrolyte (e.g. a salt) to the matrix before analysing. The added electrolyte should not contain the analyte. Alternatively the method may comprise exposing the sensor and a counterelectrode to the matrix, applying a voltage between the sensor and the counterelectrode and determining the current flow through the matrix. The voltage should be selected to be between a first voltage and a second voltage, wherein the first and second voltages are the onset voltages for the polymer in its first and second forms, as defined earlier. In this case, by determining whether the polymer is in a conductive or non-conductive form, an analyte concentration range may be determined.

The invention additionally provides a cell for analysing for an analyte in a matrix. The cell may comprise:
- a working electrode junction comprising the polymer of the present invention;
- a counter electrode,
- a voltage source, optionally a variable voltage source, and
- a current measuring device.

The working electrode and the counterelectrode may be at least partially immersed in an electrolyte.

The cell may comprise:
- a working electrode junction comprising the polymer of the present invention;
- a counter electrode,
- a reference electrode,
- a potentiometer for controlling the potential between the working electrode and the reference electrode, and
- a current measuring device.

The working electrode junction, the reference electrode and the counterelectrode may be at least partially immersed in an electrolyte.

In both of the above cells, the electrolyte may contain the analyte, and the cell may be used to determine a concentration of the analyte, or to determine the presence or absence of the analyte, or to determine if the analyte is present at or above a threshold concentration of the analyte.

BRIEF DESCRIPTION OF THE DRAWINGS

A preferred embodiment of the present invention will now be described, by way of an example only, with reference to the accompanying drawings wherein.

DETAILED DESCRIPTION OF A PREFERRED EMBODIMENT

Figure 1:
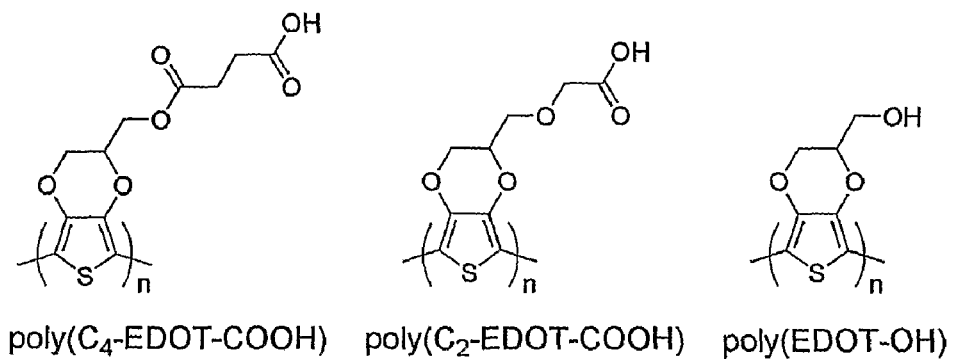
FIG. 1 shows the structures of three poly(ethylenedioxythiophenes)

In an embodiment, the present invention relates to a conductimetric response from the shift in onset potential at which the synthesized polymer, poly($C_4$-EDOT-COOH) and poly($C_2$-EDOT-COOH) (FIG. 1), become conductive. Increased negative charge density surrounding the polymer backbone raises the energy barrier for efficient migration of positive charge carrier.

The invention may have one or more of the following advantages:
1. Poly(3,4-ethylenedioxythiophene)s are stable in water, more environmentally resistant, and possess lower onset potential and larger conductive window than conventional conducting polymers.
2. The invention utilizes charge perturbation in the polymer matrix to alter the conductivity profile of conducting polymers.
3. The invention illustrates conductimetric pH response initiated by the side-chain of conducting polymers.
4. The conductivity of the conducting polymer does not change substantially. Instead, the conductimetric response is derived from the shift in conductivity curve.
5. The principles underlying the invention may be widely applied to biosensor design and fabrication.

Conducting polymers derived from 3,4-ethylenedioxythiophene (EDOT) have attracted considerable interest due to their stability, high transparency, moderate conductivity, flexibility for side-chain functionalization, and water compatibility.

Examples

Figure 2:
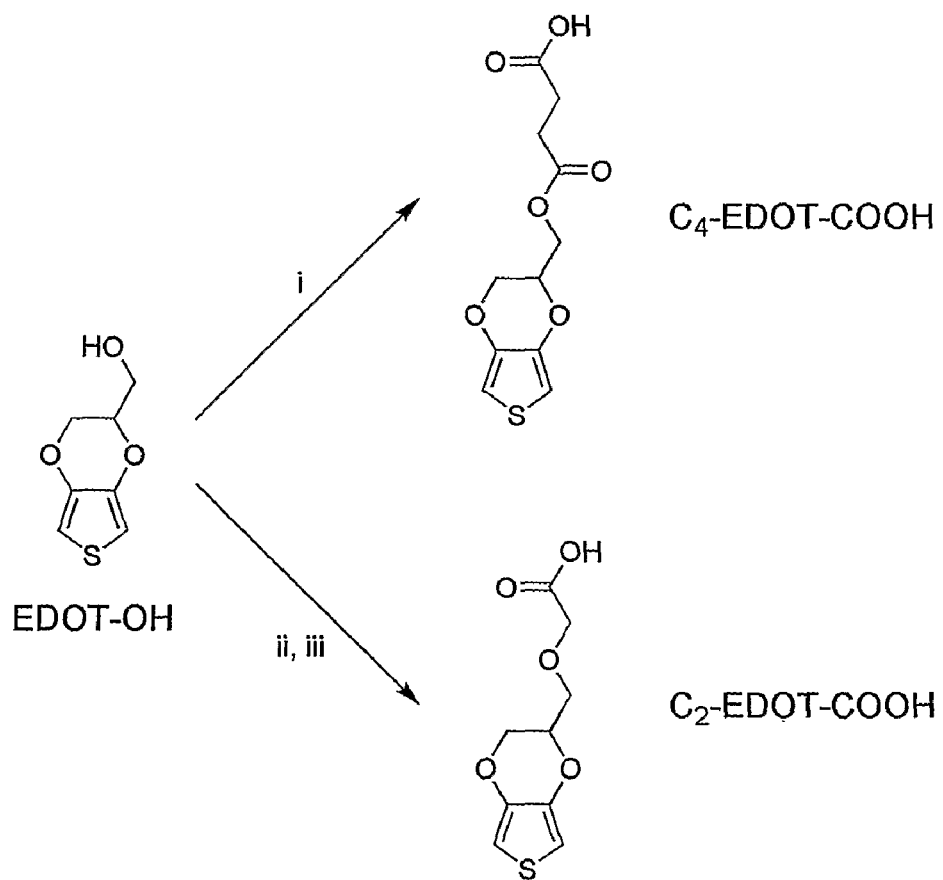
FIG. 2 shows the syntheses of $C_4$-EDOT-COOH and $C_4$-EDOT-COOH.
Figure 3:
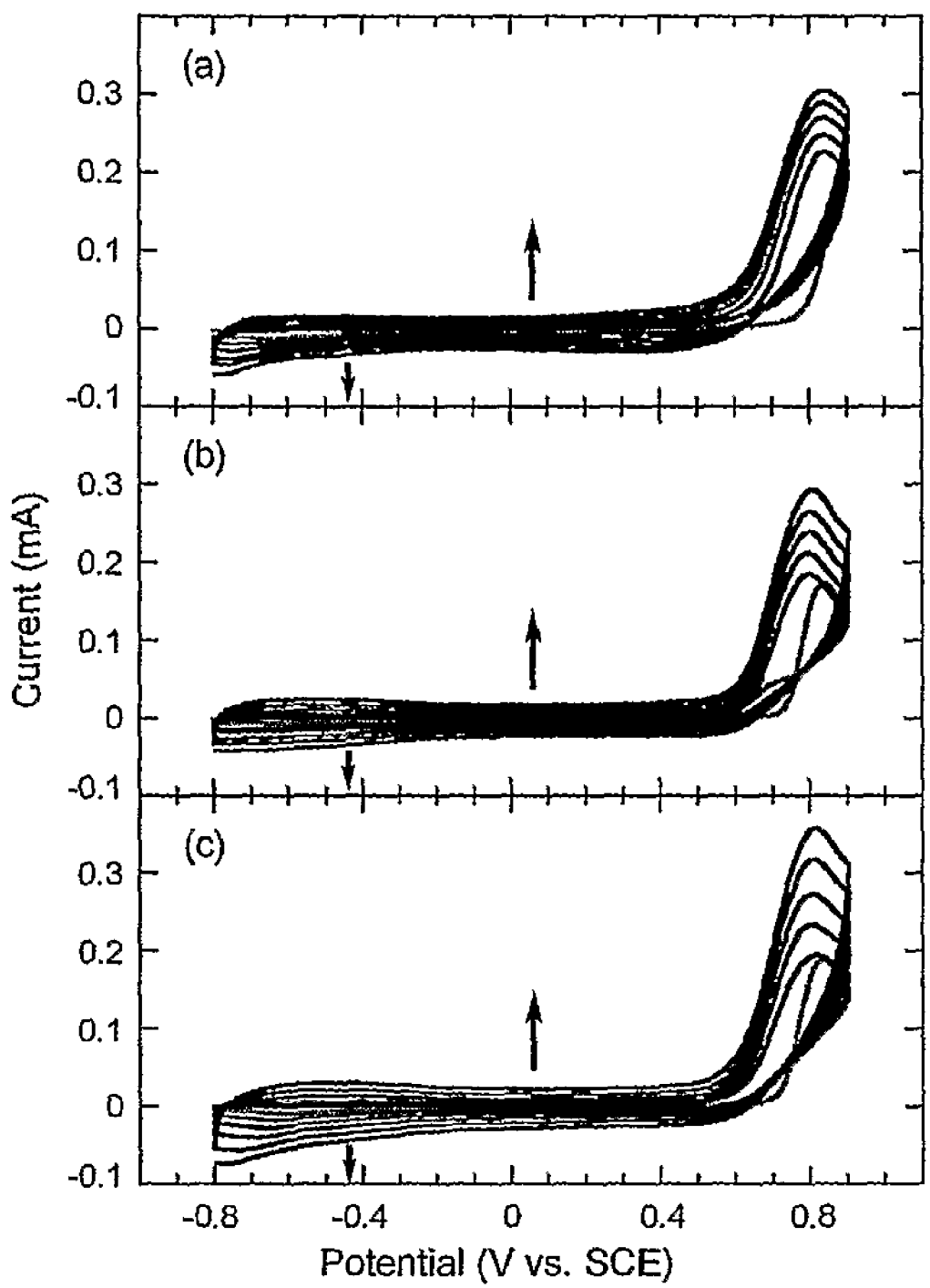
FIG. 3 shows voltage/current curves for electropolymerization of (a) $C_4$-EDOT-COOH, (b) $C_2$-EDOT-COOH, and (c) EDOT-OH at a scan rate of 100 mV/sec.

EDOT-OH as shown in FIG. 2 was synthesized according to a literature method. Carboxylic acid functionalized EDOT derivatives were subsequently synthesized through either an ester linkage ($C_4$-EDOT-COOH) or an ether linkage ($C_2$-EDOT-COOH). Conditions in FIG. 2 were: (i) succinic anhydride, triethylamine, DMAP, methylene chloride; (ii) sodium hydride, methyl 2-bromoacetate, sodium iodide, tetrahydrofuran. Electropolymerization of all three monomers was performed in $CH_3CN$ solution containing 10 mM of monomer and 0.1 M of tetrabutylammonium hexafluorophosphate ($nBu_4NPF_6$) as supporting electrolyte by repeated cycling between −0.8 and 0.9 V (referred to as saturated calomel electrode) at a scan rate of 100 mV/sec. Negative shifts in the oxidation current onset after the initial scan and new broad redox waves grew in subsequent scans, indicating polymer growth on the electrode surface as shown in FIG. 3. FIG. 3 shows curves illustrating electropolymerization of (a) $C_4$-EDOT-COOH, (b) $C_2$-EDOT-COOH, and (c) EDOT-OH at a scan rate of 100 mV/sec. Electropolymerization was performed in 0.1 M of $nBu_4NPF_6/CH_3CN$ solution containing 10 mM of the respective monomers. All three side-chain functionalized polymers displayed similar intrinsic conductivities as electropolymerized poly(EDOT) ($10^0$-$10^2$ S/cm) based on in situ conductivity measurements in PBS buffer (pH 7). It is noteworthy that all three EDOT derivatives formed very stable and electroactive polymer films in aqueous media. The conductivity and electrochemical properties remained identical after more than 100 cycles.

Figure 4:
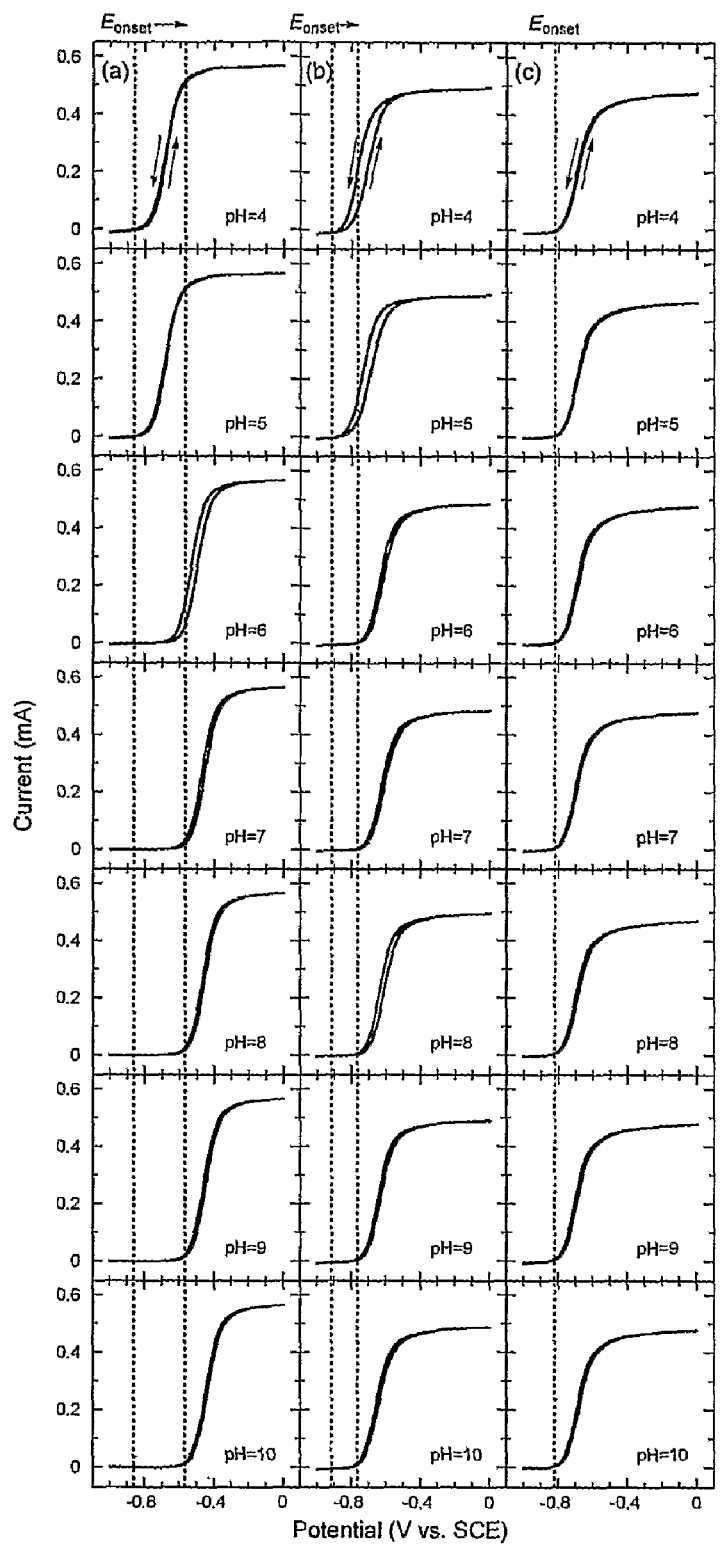
FIG. 4 shows conductivity curves of drain current measurement of (a) poly($C_4$-EDOT-COOH), (b) poly($C_2$-EDOT-COOH), and (c) poly(EDOT-OH)

Respective polymer film of poly($C_4$-EDOT-COOH), poly($C_2$-EDOT-COOH) and poly(EDOT-OH) was grown on 5-μm interdigitated microelectrodes for measurement of conductimetric response and profiles upon polymer oxidation and reduction. Applying 100 mV offset between two sets of working electrodes, the current that passed through poly($C_4$-EDOT-COOH)-covered junctions started to increase when the polymer film was applied with a potential greater than −0.86 V ($E_{onset}$) in pH 4 buffer (FIG. 4), indicating that the polymer became conductive upon oxidative doping. FIG. 4 shows drain current measurements of (a) poly($C_4$-EDOT-COOH), (b) poly($C_2$-EDOT-COOH), and (c) poly(EDOT-OH) on 5-elm interdigitated microelectrodes between pH 4 and pH 10 in 10 mM of buffer solution, with 0.1 M of $LiClO_4$ as the supporting electrolyte. The scan rate was 10 mV/sec with a 100-mV offset between the two sets of interdigitated microelectrodes. The dashed line indicated the $E_{onset}$ where the film became conductive at pH 4 and pH 10. The current reached a plateau at −0.41 V. Upon exposure to the electrolyte solution at pH 6, $E_{onset}$ shifted to a more positive value of −0.68 V. $E_{onset}$ shifted further to −0.58 V at pH 10 and the current reached a maximum at −0.19 V. $E_{onset}$ shifted back to the original value with an identical current profile when the polymer film was re-exposed to an aqueous medium at pH 4. Poly($C_2$-EDOT-COOH) film showed a similar trend with a smaller shift of $E_{onset}$ from −0.91 V at pH 4 to −0.76 at pH 10. In contrast, poly(EDOT-OH)'s current profile remained unchanged upon exposure to electrolyte solutions at different pH's. It was noteworthy that the current profiles always reached a plateau at the same level. This showed that the intrinsic conductivity of polymer films remained identical at different pH's.

Figure 5:
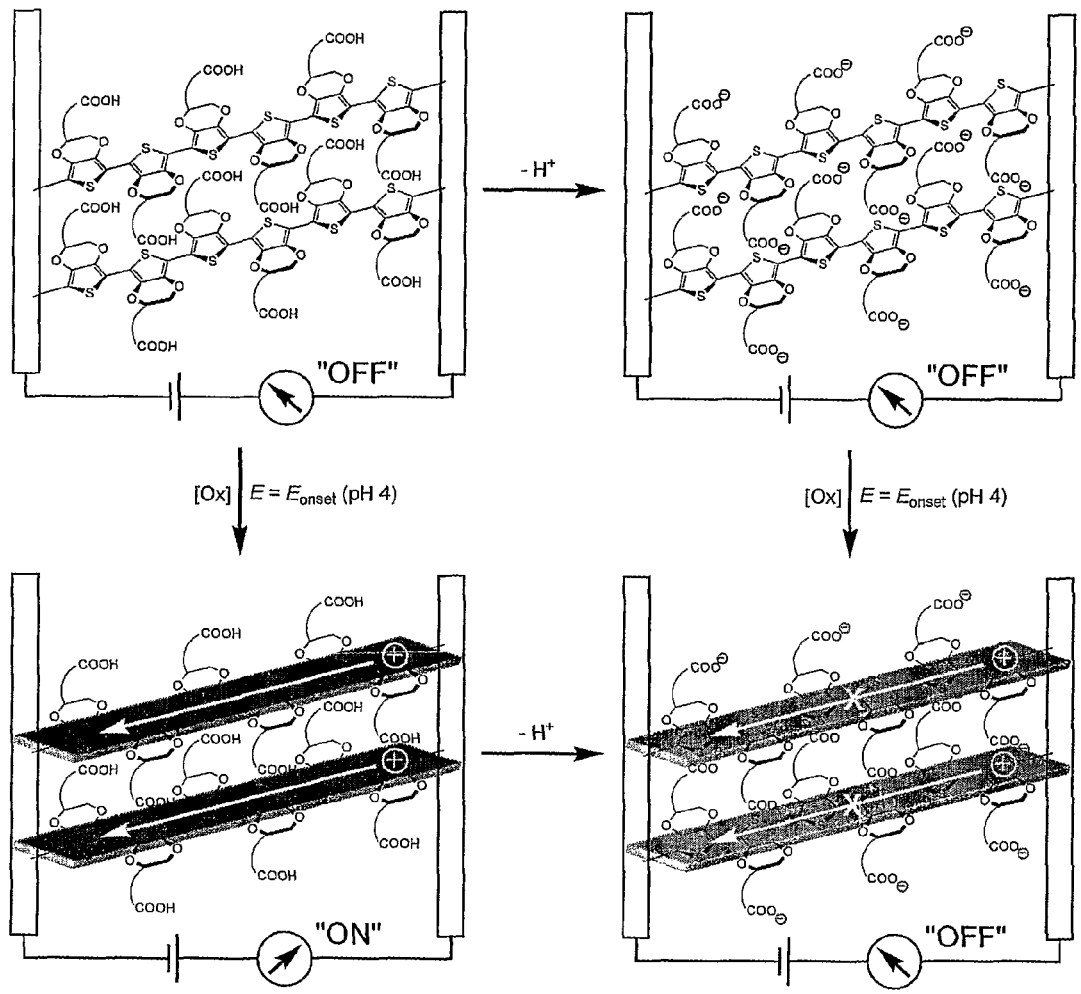
FIG. 5 is a schematic representation of the conductimetric response of a poly(EDOT-COOH)-coated interdigitated electrode in solution upon pH changes.
Figure 6:
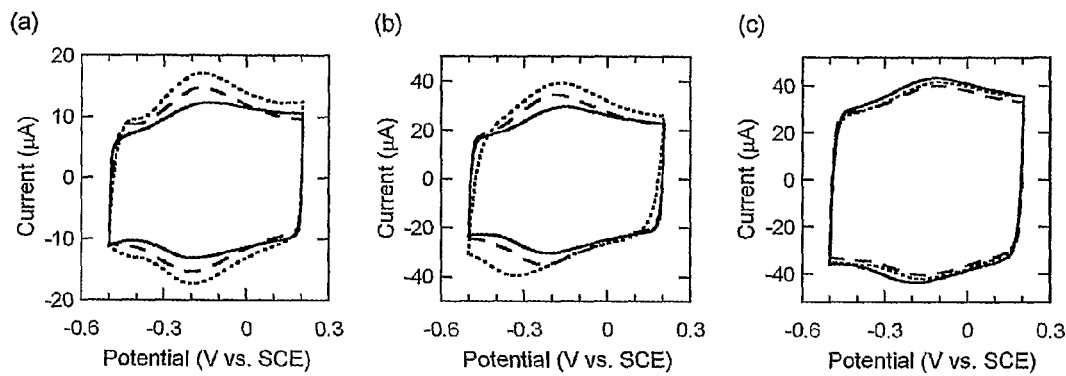
FIG. 6 shows cyclic voltammograms of (a) poly($C_4$-EDOT-COOH), (b) poly($C_2$-EDOT-COOH), and (c) poly(EDOT-OH) on Pt button electrode in 10 mM of pH 4 (-), pH 7 ( - - - ), and pH 10 ( . . . ) buffer solution.

This proton-controlled conductivity responses showed significantly different characteristics compared to the previously reported cases for polyanilines, polypyrroles, and polythiophenes. In these classical cases, deprotonation of the conducting polymer backbone/segment resulted in reduced resonance stabilization of the charge carriers. Therefore, the intrinsic conductivity of the polymers decreased. FIG. 5 showed a schematic rationale of the phenomenon described previously. This it shows a schematic representation of the conductimetric response of the poly(EDOT-COOH)-coated interdigitated electrode in solution upon pH changes. In the case of poly(EDOT-COOH), deprotonation of the polymer side-chain increased the negative charge density in the polymer matrix and surrounding the polymer backbone. Migration of the positive charge carriers in ECP (radical cations and dications) then became less energetically favorable. This rationale was also supported by the fact that the current profile began to shift at pH 5 to 6 where the carboxylic acid deprotonated to form carboxylate. Cyclic voltammograms of the polymer films (FIG. 6) showed increased peak current and larger difference between anodic and cathodic peak potentials at higher pH, suggesting that the charge carriers were more localized and kinetically restrained. FIG. 6 shows cyclic voltammograms of (a) poly($C_4$-EDOT-COOH), (b) poly($C_2$-EDOT-COOH), and (c) poly(EDOT-OH) on Pt button electrode in 10 mM of pH 4 (-), pH 7 (- - -), and pH 10 (. . .) buffer solution, with 0.1 M of $LiClO_4$ as the supporting electrolyte at a scan rate of 50 mV/sec. However, the resonance stabilization structure of the polymer backbone remained identical as that in a neutral polymer matrix. The same conductivity could still be achieved by increased charge carrier density or charge mobility when a more positive potential was applied.

Figure 7:
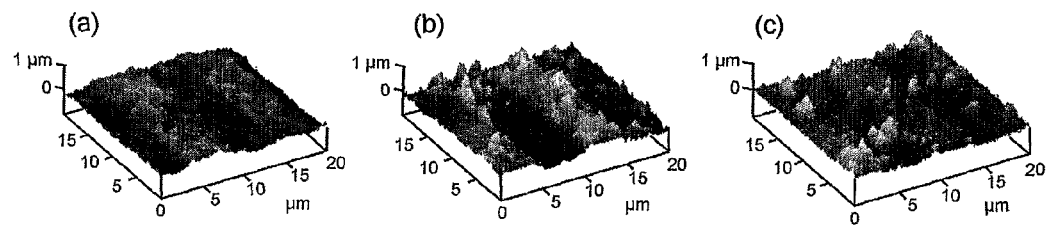
FIG. 7 shows AFM images of (a) poly($C_4$-EDOT-COOH), (b) poly($C_2$-EDOT-COOH), and (c) poly(EDOT-OH) on 5-μm interdigitated microelectrodes.

Atomic force microscopy (AFM) images of the respective polymer films on interdigitated microelectrode (FIG. 7) showed that poly($C_4$-EDOT-COOH) packed most densely on the surface of the electrode. FIG. 7 shows AFM images of (a) poly($C_4$-EDOT-COOH), (b) poly($C_2$-EDOT-COOH), and (c) poly(EDOT-OH) on 5-μm interdigitated microelectrodes. Poly($C_4$-EDOT-COOH) also displayed the smoothest surface. This was mostly attributed to the more rigid ester linkage of the side-chain. The densely packed structure might explain the larger $E_{onset}$ shift of poly($C_4$-EDOT-COOH). A larger negative charge density surrounding individual polymer chain has resulted from the more well-packed polymer matrix. However, the molecule-induced microenvironmental difference around the polymer chain was more dominant compared to the bulk material morphology. This was supported by the different pH response from poly($C_2$-EDOT-COOH) and poly(EDOT-OH), which displayed a similar surface morphology.

Figure 8:
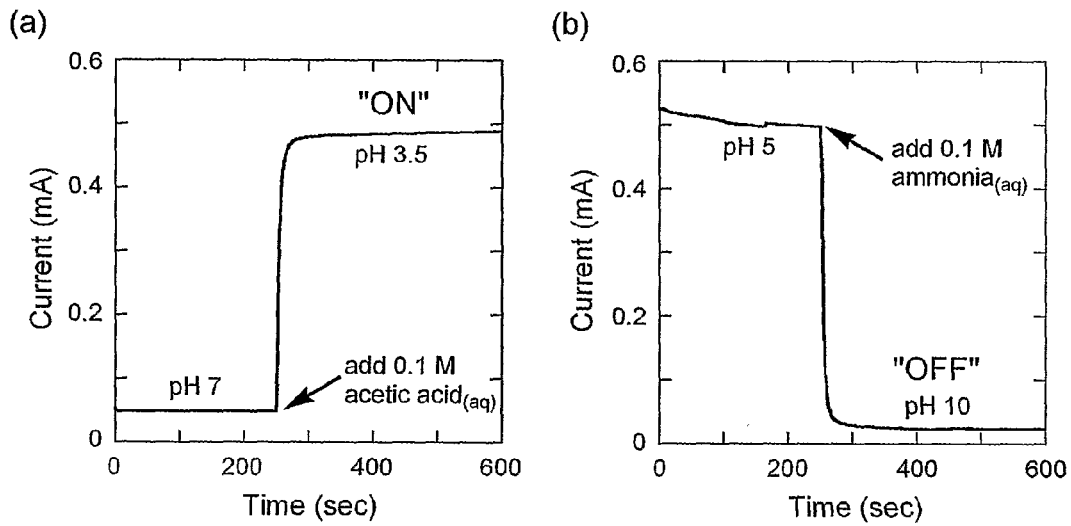
FIG. 8 shows curves of dynamic current measurement of poly($C_4$-EDOT-COOH) on microelectrodes with applied potentials (a) −0.60 V and (b) −0.65 V.

The poly($C_4$-EDOT-COOH)-coated electrodes were applied as resistive sensors for real-time measurements of the solution pH value. For all measurements, the polymer films were applied with a given potential with a 100 mV offset. FIGS. 8(a) and 8(b) show the real-time "turn-on" and "turn-off" responses, respectively. In the "turn-on" experiment, the polymer film was placed in a pH 7 solution by applying −0.6 V. We observed a current increase by more than 7 folds within 10 sec upon the addition of acetic acid. The solution became more acidic (pH 3.5) and the film became conductive due to the $E_{onset}$ shift to a lower potential. In contrast, the current passing though electrodes by applying a potential of −0.65 V was reduced by over 90% within 10 sec when the pH of the immersed solution changed from 5 to 10 with the addition of aqueous ammonia solution.

In summary, we have demonstrated a real-time pH-responsive conducting derivatized poly(3,4-ethylenedioxythiophene). Although the intrinsic conductivity of the polymer does not change, the conductivity profile is shifted with applied potential due to the loss/enhancement of charge carrier mobility from varying the negative charge density in the polymer matrix. This is a first example of utilizing such sensing principle, which can be applicable towards biomolecule detection.

Figure 9:
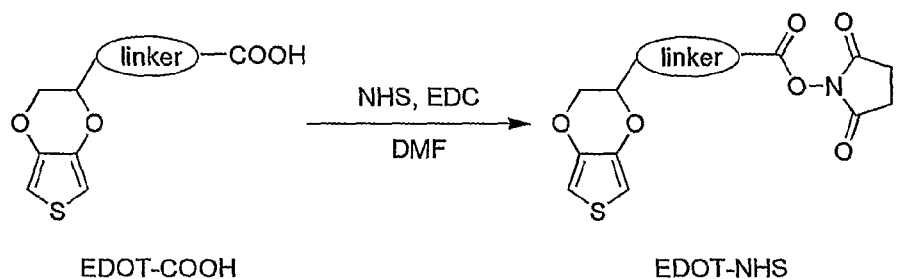
FIG. 9 shows the synthesis of EDOT-NHS.
Figure 10:
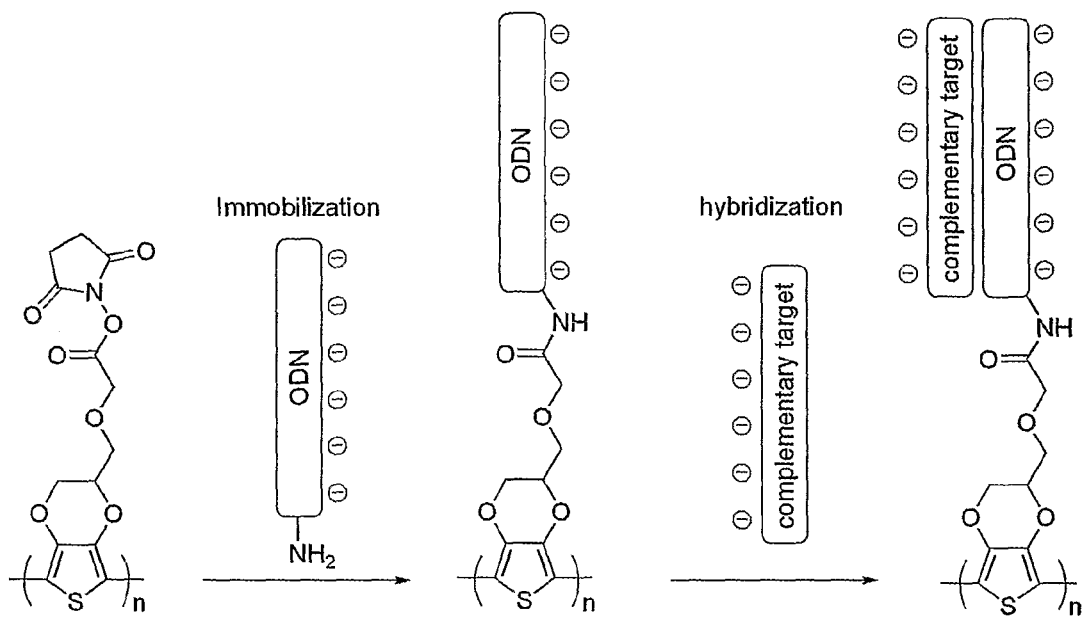
FIG. 10 shows the synthesis of oligodeoxynucleotide (ODN)-grafted polyEDOT.
Figure 11:
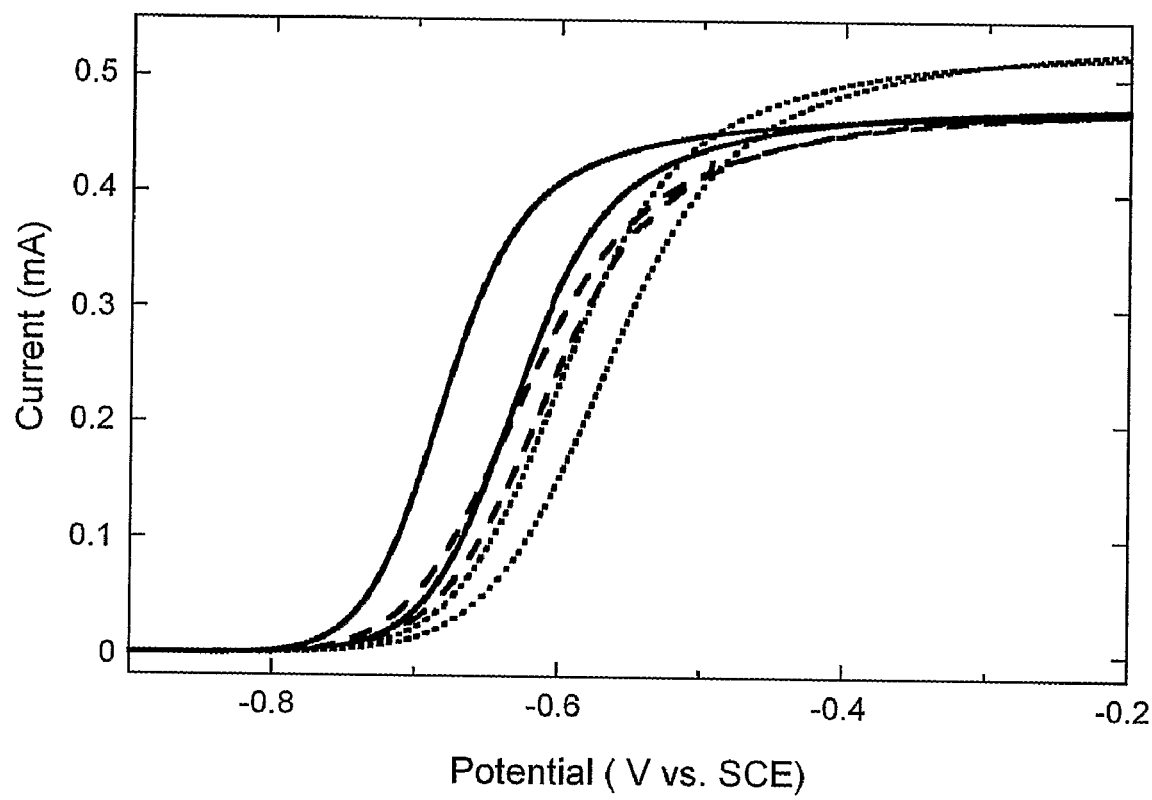
FIG. 11 shows curves showing drain current measurement of poly($C_2$-EDOT-NHS) (-), poly($C_2$-EDOT-ODN) ( - - - ), and poly(C2-EDOT-ODN) hybridized with complementary targets ( . . . ).

The same principle as described in the paper can be applied for nucleic acids (DNA, mRNA, microRNA, etc.) due to the polyanionic characteristic of nucleic acids. FIG. 9 illustrates the synthesis of EDOT-NHS. As shown in FIG. 9, the carboxylic acid group was activated with N-hydroxysuccinimide to yield EDOT-NHS derivatives. EDOT-NHS monomer was electropolymerized in the similar condition (0.1 M of $nBu_4NPF_6/CH_3CN$ solution containing 10 mM of the respective monomers). FIG. 10 shows the synthesis of oligodeoxynucleotide (ODN)-grafted polyEDOT. The synthesized poly (EDOT-NHS) was grafted with amino-functionalized oligodeoxynucleotides (ODN) as capture probes (FIG. 10). FIG. 11 shows drain current measurements of poly($C_2$-EDOT-NHS) (-), poly($C_2$-EDOT-ODN) ( - - - ), and poly(C2-EDOT-ODN) hybridized with complementary targets ( . . . ) on 5-μm interdigitated microelectrodes in 0.1 M aqueous $LiClO_4$ solution. The scan rate was 10 mV/sec with a 100-mV offset between the two sets of interdigitated microelectrode. $E_{onset}$ and the conductivity curve shifted to more positive potential upon the formation of ODN-grafted polyEDOT (poly(EDOT-ODN)) as shown in FIG. 11. This finding is in agreement with our hypothesis that the increased negative charge density in the polymer matrix in which the migration of the positive charge carriers (radical cations and dications) became less energetically favorable. After hybridization with complementary targets, the conductivity curve shifted to more positive potential because of the additional negative charge introduced by the hybridized targets. This phenomenon allows us to apply the same principle for nucleic acid detection or other polyanionic biomolecules.

Experimental $C_4$-EDOT-COOH. A solution of succinic anhydride (283 mg, 2.83 mmol), 4-dimethylaminopyridine (DMAP; 12.3 mg, 0.12 mmol) and triethylamine ($Et_3N$) (0.25 mL, 344 mg, 1.97 mmol) in $CH_2Cl_2$ (4.9 mL) was added dropwise to a solution of 2,3-dihydrothienol[3,4-b][1,4]dioxin-2-ylmethanol (EDOT-OH, 230 mg, 1.36 mmol) in $CH_2Cl_2$ (12.3 mL), and stirred at room temperature overnight. The solution was washed with 10% aqueous HCl solution twice, deionized water four times, and saturated NaCl aqueous solution, and dried ($MgSO_4$). $C_4$-EDOT-COOH (202 mg, 55%) was obtained as a yellow oil after solvent removal under reduced pressure.

$C_2$-EDOT-COOCH$_3$. A 100-mL round-bottom flask was charged with a stir bar, 2,3-dihydrothienol[3,4-b][1,4]dioxin-2-ylmethanol (EDOT-OH, 861 mg, 5.0 mmol), NaI (150 mg, 1.0 mmol) and NaH (60% suspension in mineral oil, 240 mg, 6.0 mmol), and the flask was backfilled with argon thrice. Dry tetrahydrofuran (THF, 20 mL) was introduced, and the suspension was stirred for 15 min and cooled in an ice bath. Methyl bromoacetate (0.57 mL, 0.92 g, 6.0 mmol) was added dropwise, and the reaction mixture was stirred for 18 h. The majority of THF was removed with a rotary evaporator; the crude product was partitioned between water and ethyl acetate, and further extracted twice with ethyl acetate. The combined organic layers were washed with brine, dried ($MgSO_4$) and evaporated. The crude product was purified with a silica gel column (hexane/ethyl acetate=5:1).

$C_2$-EDOT-COOH. $C_2$-EDOT-COOCH$_3$ (610 mg, 2.5 mmol) was dissolved in THF (10 mL) in a 100-mL round-bottom flask, and freshly prepared aqueous NaOH solution (2 M; 10 mL) was added. The mixture was stirred vigorously until the starting material was completely consumed by thin layer chromatography (TLC) (3 h). The mixture was acidified to pH<3, and then extracted with ethyl acetate (5×). The combined organic layers were washed with water until neutral, dried ($MgSO_4$), and evaporated. $C_2$-EDOT-COOH (480 mg, 83%) was obtained as a thick, colorless oil that solidified upon standing overnight.

Electrochemistry. All electrochemical measurements were made with an Autolab PGSTAT 30 potentiostat (Metrohm) under ambient conditions. Normally, the experiments were performed in a one-chamber, three-electrode configuration consisting of a Pt button electrode (BioAnalytical Systems or CH Instrument) or a 5-μm interdigitated microelectrode (IME, Abtech Scientific Inc.) as the working electrode, a Ag/Ag$^+$ (BioAnalytical Systems, Ag wire submersed in 10 mM of AgNO$_3$ in CH$_3$CN with 0.1 M of nBu$_4$NPF$_6$) reference electrode (non-aqueous solution) or a saturated calomel reference electrode (SCE) (aqueous solution), and a Pt coil/mesh counter electrode. All electrochemical potential was reported to SCE unless otherwise noted. The supporting electrolyte was generally 0.1 M of nBu$_4$NPF$_6$ for non-aqueous solution and 0.1 M of LiClO$_4$ for aqueous buffers. Buffer solutions were prepared with acetate (pH 4.0-6.0), phosphate (pH 7.0-8.0) and ammonium (pH 9.0-10.0).

Electropolymerization. Typical experiments were conducted with 0.1 M nBu$_4$NPF$_6$ as supporting electrolyte in CH$_3$CN consisting of 10 mM of respective monomers. Polymer films were oxidatively polymerized by repeated potential sweeps between −0.5 and 1.2 V (vs. Ag/Ag$^+$) at room temperature, with a scan rate of 100 mV/s. Potential was applied over 10 cycles and 2 cycles for film growth on Pt button electrodes and interdigitated microelectrodes, respectively. The polymer films were rinsed in monomer-free CH$_3$CN solvent, and air-dried prior to further measurements.

Cyclic voltammetry. Polymer films on Pt button electrodes were soaked in various buffer solutions containing 0.1 M of LiClO$_4$ as the supporting electrolyte for 10 min before the measurement was performed in a Faraday cage utilizing standard three-electrode setup. The voltammograms were generally obtained at a scan rate of 50 mV/s.

Conductivity (drain current) measurements. Conducting polymers were electropolymerized on interdigitated microelectrodes (IMEs). The device was soaked in the buffer solution containing 0.1 M of LiClO$_4$ as the supporting electrolyte for 10 min. These experiments were typically run at a scan rate of 10 mV/s with a 100-mV offset between the two working electrodes. The intrinsic conductivity (σ) can be calculated with the following equation, where $i_D$ is the drain current, $V_D$ is the offset potential, and T is the polymer thickness, with a 5-μm gap (D), n=99 gaps, and a 0.5-cm electrode length (L). We also corrected the value with poly(EDOT) as 100 S cm$^{-1}$.

$$\sigma = \frac{i_D}{V_D} \cdot \frac{D}{n \cdot T \cdot L}$$

Real-time current response. Poly($C_4$-EDOT-COOH) grown on IME was placed in a glass cell with 1.5 ml of electrolyte solution under ambient conditions. The real-time current output from a 100-mV offset potential applied between the two working electrodes was measured over a period of 600 sec. An equal volume of either aqueous solution containing 10 mM acetic acid/0.1 M LiClO$_4$ or aqueous solution containing 10 mM ammonia/0.1 M LiClO$_4$ was added after 250 sec to change the pH of the electrolyte solution.

Immobilization of amine-functionalized ODN with poly ($C_2$-EDOT-NHS). Films of poly(C2-EDOT-NHS) was electropolymerized in 0.1 M nBu$_4$NPF$_6$ as supporting electrolyte in CH$_3$CN, consisting of 10 mM of the respective monomers. Polymer films were oxidatively polymerized by repeated potential sweeps between −0.5 and 1.2 V (vs. Ag/Ag$^+$) at room temperature, with a scan rate of 100 mV/s. After washing the films completely with CH$_3$CN and deionized water, amine-functionalized ODN aqueous solution (10 μL) was dropped to cover the surface of the electrode. The immobilization was carried out in moisture-controlled chamber for 4 hours and the electrode was thoroughly washed with deionized water (×3) and then dried by air flow.

The invention claimed is:
1. A sensor for an analyte comprising:
   a working electrode junction comprising a polymer,
   a counterelectrode,
   a variable voltage source, and
   a current measuring device;
   whereby exposure of said polymer to the analyte is capable of causing a shift in the onset potential for conductivity or semiconductivity of said polymer, said polymer comprising monomer units of structure I,

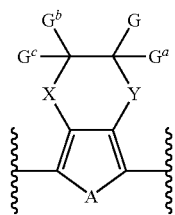

wherein:
A, X and Y are independently selected from the group consisting of O, S, Se, Te and NR, where R is selected from the group consisting of optionally substituted alkyl groups and optionally substituted aryl groups, G is a group which, in a form in which it is unbound to the analyte, is capable of interacting with the analyte, and is selected from the group consisting of $CH_2OCH_2$-carboxyl and $CH_2OCH_2C(O)NH$-(oligodeoxynucleotide), and $G^a$, $G^b$ and $G^c$ are independently selected from the group consisting of hydrogen, optionally substituted alkyl groups and optionally substituted aryl groups.

2. The sensor of claim 1 additionally comprising a reference electrode.

3. The sensor of claim 2 wherein the working electrode and the counterelectrode are immersed in an electrolyte.

4. The sensor of claim 3 wherein the electrolyte comprises the analyte.

5. The sensor of claim 1 wherein $G^a$, $G^b$ and $G^c$ are all H and X and Y are both O.

6. The sensor of claim 1, wherein X and Y are O; $G^a$, $G^b$, and $G^c$ are H; and A is S, to define said polymer being a poly(ethylenedioxythiophene) of structure II,

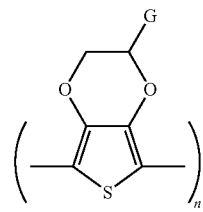

wherein n is the degree of polymerisation.

7. The sensor of claim 1 wherein the polymer is metal free.

8. A method for using the sensor of claim 1 for analysing for the analyte in a matrix, said method comprising exposing said sensor to the matrix and determining the onset potential for conductivity or semiconductivity of the polymer of said sensor.

9. The sensor of claim 1, wherein X and Y are O; $G^a$, $G^b$, and $G^c$ are H; and A is S, to define said polymer being a poly(ethylenedioxythiophene) of structure II,

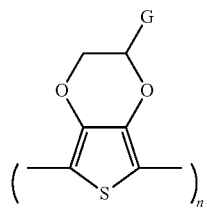

wherein n is the degree of polymerisation, and wherein the oligodeoxynucleotide comprises a nucleotide fragment which is complementary to a nucleic acid sequence in the analyte.

* * * * *